(12) United States Patent
Yonemura

(10) Patent No.: US 12,287,248 B2
(45) Date of Patent: Apr. 29, 2025

(54) PIEZOELECTRIC SENSOR AND ROBOT HAND

(71) Applicant: SEIKO EPSON CORPORATION, Tokyo (JP)

(72) Inventor: Takayuki Yonemura, Suwa (JP)

(73) Assignee: SEIKO EPSON CORPORATION (JP)

(*) Notice: Subject to any disclaimer, the term of this patent is extended or adjusted under 35 U.S.C. 154(b) by 200 days.

(21) Appl. No.: 17/852,971

(22) Filed: Jun. 29, 2022

(65) Prior Publication Data

US 2023/0003590 A1 Jan. 5, 2023

(30) Foreign Application Priority Data

Jun. 30, 2021 (JP) ................................. 2021-108749

(51) Int. Cl.
*G01L 1/16* (2006.01)
*B25J 13/08* (2006.01)
*G01L 5/00* (2006.01)
*H10N 30/30* (2023.01)

(52) U.S. Cl.
CPC ............... *G01L 1/16* (2013.01); *B25J 13/085* (2013.01); *G01L 5/009* (2013.01); *H10N 30/302* (2023.02)

(58) Field of Classification Search
CPC .. G01L 1/16; G01L 5/009; G01L 5/226; B25J 13/085; B25J 13/083; B25J 19/028; H10N 30/302
See application file for complete search history.

(56) References Cited

U.S. PATENT DOCUMENTS

| 9,816,886 | B2* | 11/2017 | Inazumi | G01L 1/16 |
| 2015/0019013 | A1* | 1/2015 | Rose | B25J 13/08 |
| | | | | 702/41 |
| 2016/0109311 | A1* | 4/2016 | Inazumi | G01L 5/226 |
| | | | | 73/862.042 |
| 2019/0030732 | A1* | 1/2019 | Kondoh | G01L 5/226 |
| 2022/0250253 | A1 | 8/2022 | Nabeto et al. | |

FOREIGN PATENT DOCUMENTS

| JP | H10300594 A | * 11/1998 |
| JP | 2004-077346 A | 3/2004 |
| JP | 2007-171059 A | 7/2007 |
| JP | 2008-183181 A | 8/2008 |

(Continued)

OTHER PUBLICATIONS

JPH10300594 A (Year: 1998).*

*Primary Examiner* — Kristina M Deherrera
*Assistant Examiner* — Fatemeh Esfandiari Nia
(74) *Attorney, Agent, or Firm* — Harness, Dickey & Pierce, P.L.C.

(57) ABSTRACT

A piezoelectric sensor includes an elastic body, a piezoelectric element which is disposed at a position where the piezoelectric element has contact with the elastic body, and which is configured to output a voltage signal when deforming in accordance with a deformation of the elastic body, and a detector configured to detect the voltage signal output from the piezoelectric element, wherein the detector detects kinetic frictional force generated between the object and the elastic body based on a variation in the voltage signal due to the relative movement of the object to the elastic body.

12 Claims, 22 Drawing Sheets

(56) References Cited

FOREIGN PATENT DOCUMENTS

| | | |
|---|---|---|
| JP | 2009-069028 A | 4/2009 |
| JP | 2012-122790 A | 6/2012 |
| JP | 2018-072024 A | 5/2018 |
| JP | 2018-182009 A | 11/2018 |
| JP | 2020-016550 A | 1/2020 |
| WO | 2020-246007 A1 | 12/2020 |

\* cited by examiner

FIG. 5
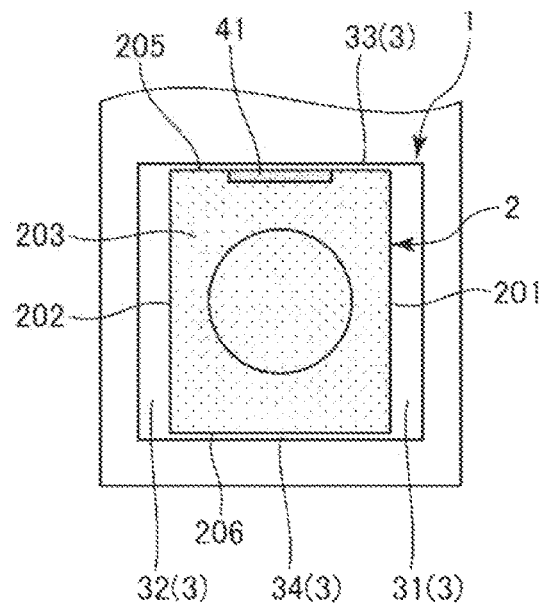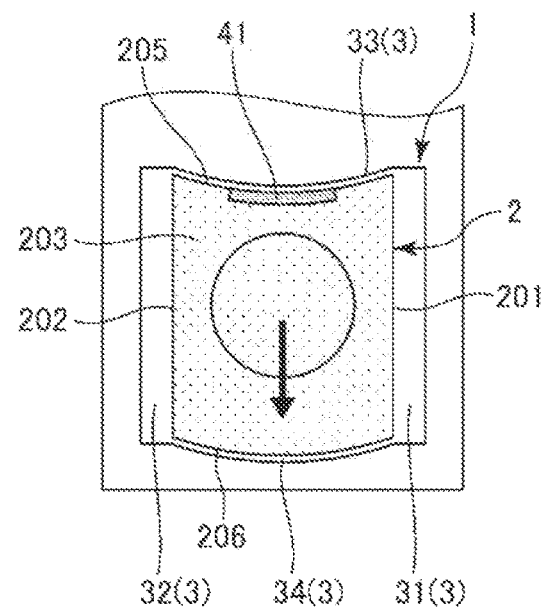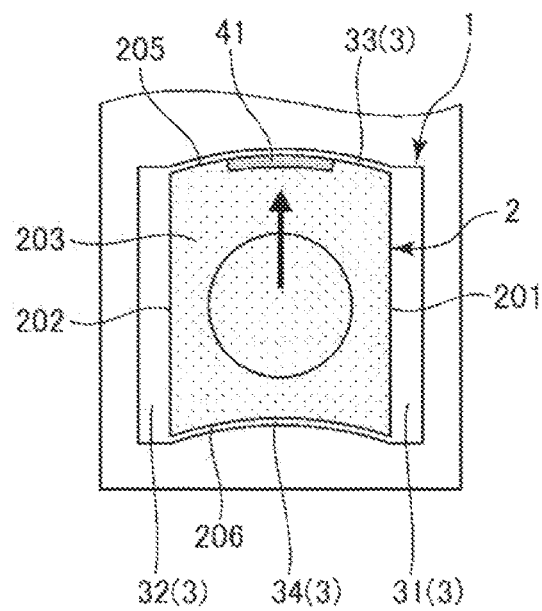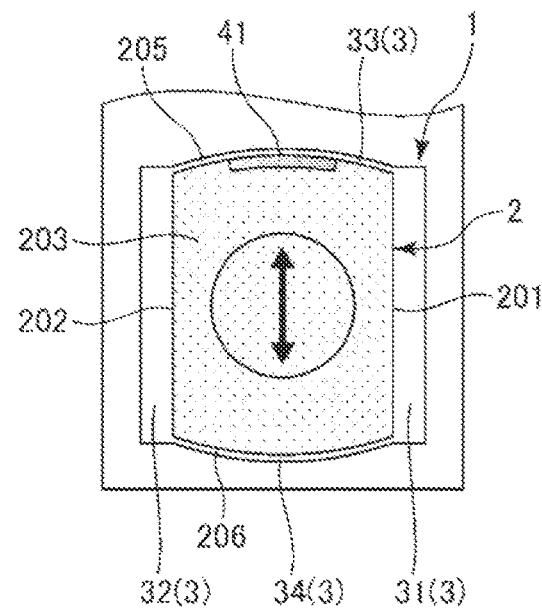

FIG. 11
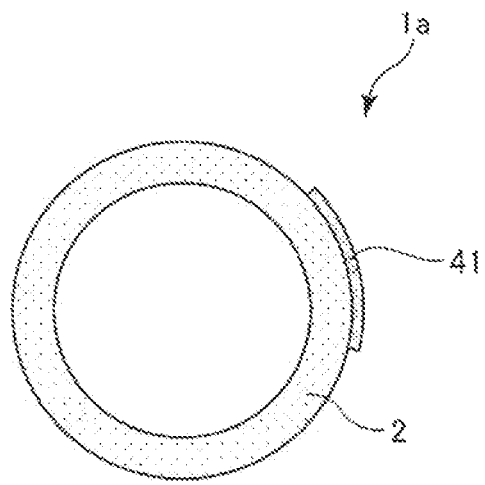
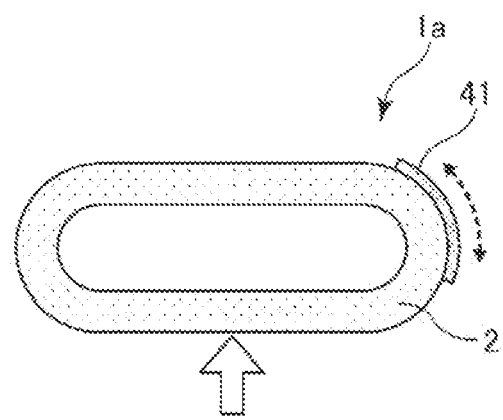
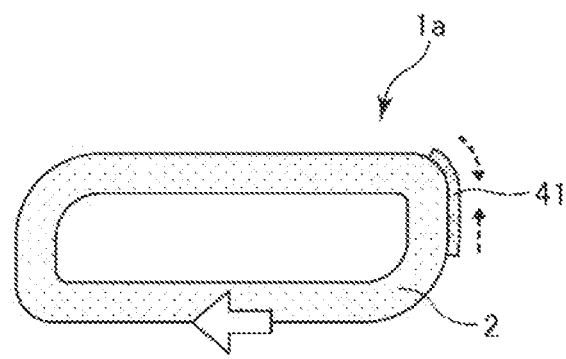
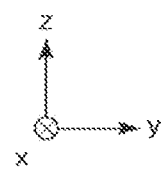

FIG. 15
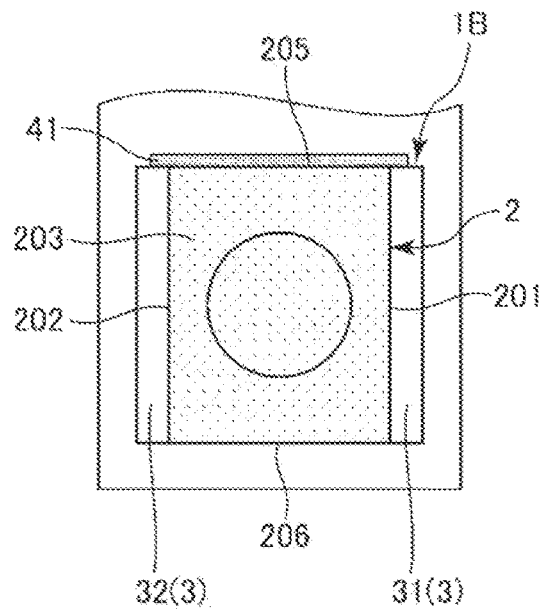
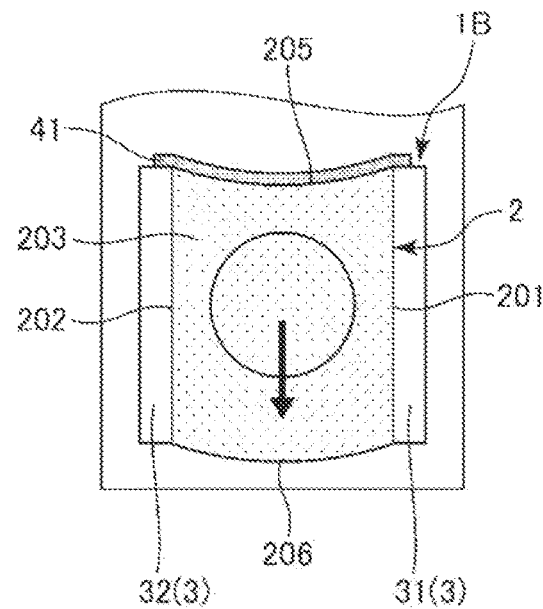
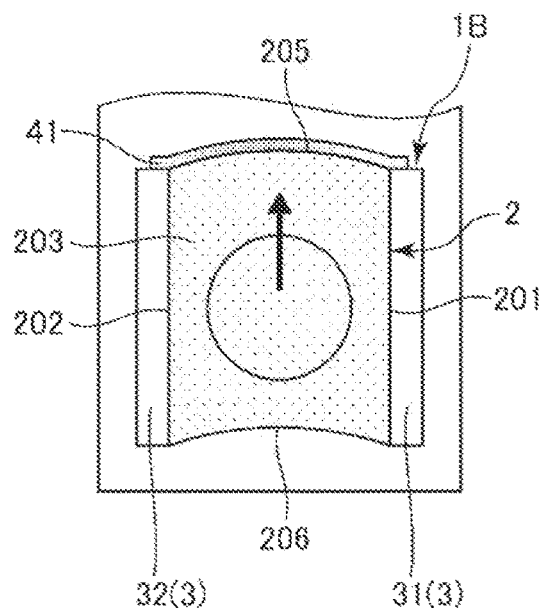
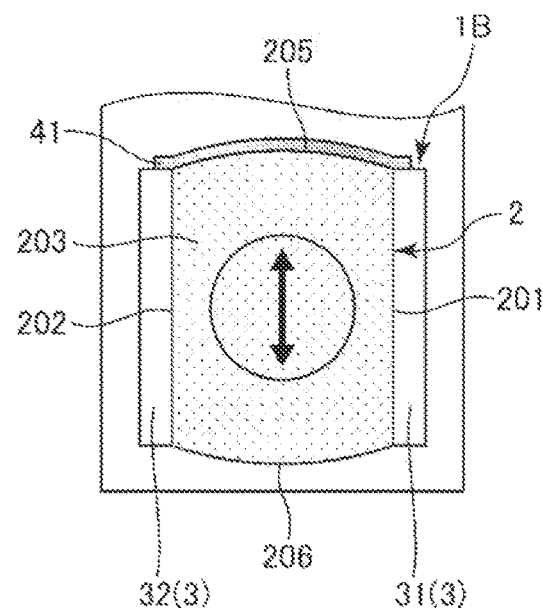

PIEZOELECTRIC SENSOR AND ROBOT HAND

The present application is based on, and claims priority from JP Application Serial Number 2021-108749, filed Jun. 30, 2021, the disclosure of which is hereby incorporated by reference herein in its entirety.

BACKGROUND

1. Technical Field

The present disclosure relates to a piezoelectric sensor and a robot hand.

2. Related Art

In JP-A-2018-72024 (Document 1), there is disclosed a robot having a gripping device provided with a pressure sensor as an industrial robot used in a manufacturing line or the like. The pressure sensor is a sensor for outputting pressure as an electric signal.

The gripping device is provided with a pair of gripping sections which are openable and closable, and the pressure sensor provided to the gripping sections. When a gripping target article is gripped by the gripping sections, the pressure sensor makes contact with the gripping target article to thereby deform, and thus, a voltage signal is output from the pressure sensor. A control device of the robot controls gripping force of the gripping device based on the voltage signal.

This pressure sensor has a first electrode, a second electrode, and an intermediate layer as a piezoelectric body which is disposed between the first electrode and the second electrode, and generates electricity due to a deformation. Between each of the electrodes and the intermediate layer, there is caused a change in capacitance, and thus, the electricity is generated. By detecting an amount of the generation of the electricity and presence or absence of the generation of the electricity, the pressure sensor functions.

In the pressure sensor described in Document 1, the electricity is generated when the intermediate layer deforms, but in order to generate the electricity, it is necessary for the intermediate layer to be pressurized along a direction connecting the first electrode and the second electrode to each other. Therefore, it is possible for the present pressure sensor to detect gripping force received when, for example, the gripping sections grip the gripping target article.

However, even when the gripping target article slips with respect to the gripping sections, the gripping force hardly changes. Therefore, it is difficult for the pressure sensor described in Document 1 to detect the fact that the gripping target article has slipped with respect to the gripping sections.

SUMMARY

A piezoelectric sensor according to an application example of the present disclosure includes an elastic body, a piezoelectric element which is disposed at a position where the piezoelectric element has contact with the elastic body, and which is configured to output a voltage signal when deforming in accordance with a deformation of the elastic body, and a detector configured to detect the voltage signal output from the piezoelectric element, wherein when the elastic body makes contact with an object and then the elastic body moves relatively to the object, the detector detects kinetic frictional force generated between the object and the elastic body based on a variation in the voltage signal due to the relative movement of the object.

A robot hand according to an application example of the present disclosure includes the piezoelectric sensor according to the application example of the present disclosure.

BRIEF DESCRIPTION OF THE DRAWINGS

FIG. 5 is a diagram for explaining a deformation mode of an elastic body when force is applied from a variety of directions to the piezoelectric sensor shown in FIG. 3.

FIG. 11 is a diagram for explaining a deformation mode of an elastic body when force is applied from a variety of directions to the piezoelectric sensor shown in FIG. 10.

FIG. 15 is a diagram for explaining a deformation mode of an elastic body when force is applied from a variety of directions to the piezoelectric sensor shown in FIG. 14.

DESCRIPTION OF EXEMPLARY EMBODIMENTS

Some preferred embodiments of a piezoelectric sensor and a robot hand according to the present disclosure will hereinafter be described in detail based on the accompanying drawings.

1. Robot Hand

First, the robot hand according to the embodiment will be described.

Figure 1:
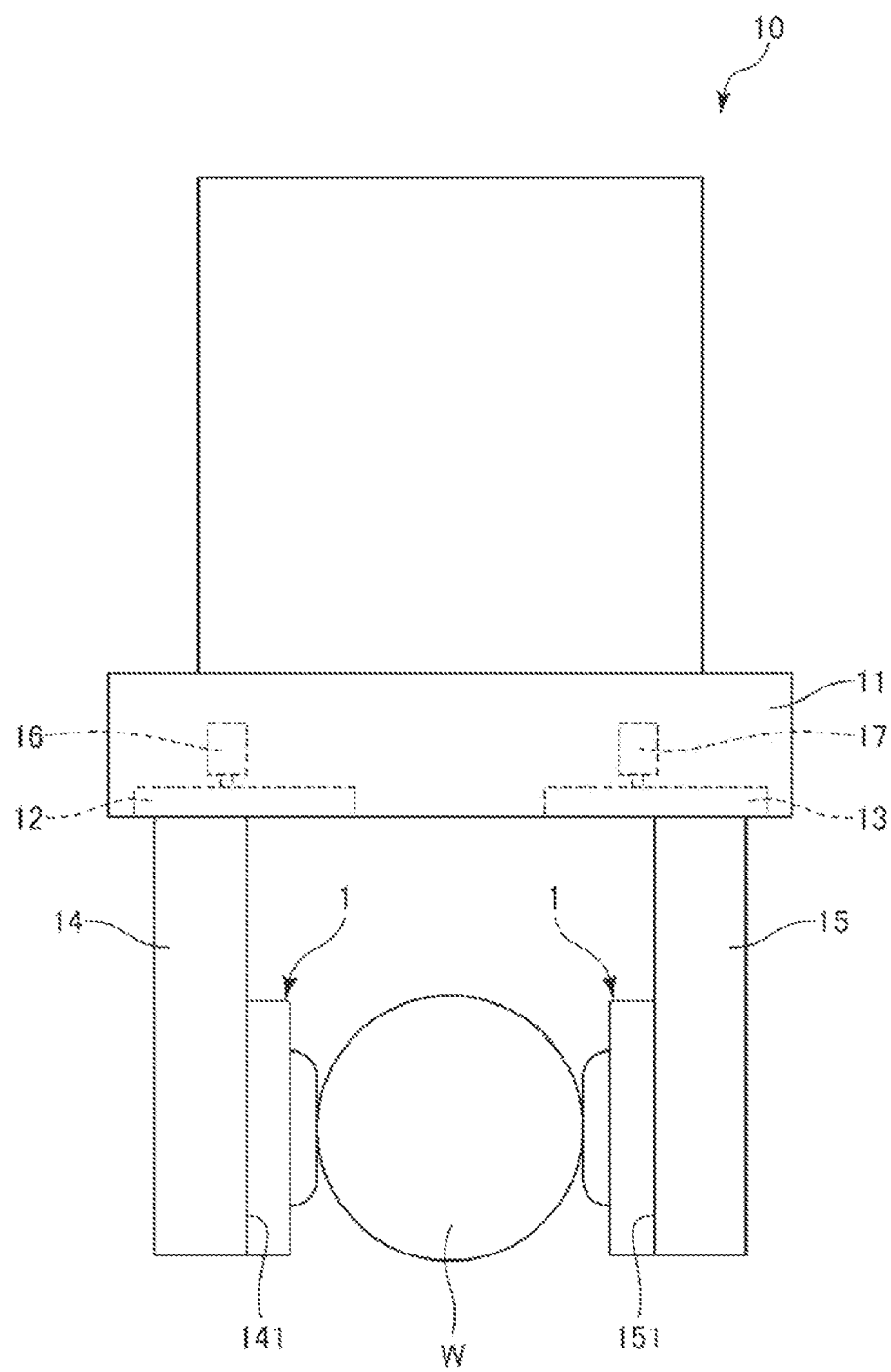
FIG. 1 is a diagram showing a robot hand according to an embodiment.

FIG. 1 is a diagram showing the robot hand according to the embodiment. It should be noted that in FIG. 1, an X axis, a Y axis, and a Z axis are set as three axes perpendicular to each other. Each of the axes is represented by an arrow, and a tip side is defined as a "positive" side, and a base end side is defined as a "negative" side. In the following description, an "X-axis direction," for example, includes both of the positive direction and the negative direction in the X axis. Further, in the following description, the description will be presented defining the positive side in the Z axis is referred to as an "upper side," and the negative side in the Z axis is referred to as a "lower side" in some cases.

A robot hand 10 shown in FIG. 1 is provided with a pair of finger parts 14, 15. By changing a distance between the finger part 14 and the finger part 15, it is possible to pinch an object W from both sides to grip the object W, and release the object W having once been gripped.

The robot hand 10 has a base 11, a pair of sliders 12, 13, the finger parts 14, 15, motors 16, 17, and piezoelectric sensors 1, wherein the pair of sliders 12, 13 slide with respect to the base 11, the finger parts 14, 15 are respectively fixed to the sliders 12, 13, and the motors 16, 17 respectively slide the sliders 12, 13. A configuration of the robot hand is not limited to the above.

The sliders 12, 13 are made slidable in the X-axis direction with respect to the base 11, respectively. Further, the motor 16 is coupled to the slider 12, and the slider 12 slides due to the drive by the motor 16. Similarly, the motor 17 is coupled to the slider 13, and the slider 13 slides due to the drive by the motor 17.

By selecting the rotational direction of the motors 16, 17 to move the sliders 12, 13 toward the respective directions opposite to each other, it is possible to make the finger parts 14, 15 come closer to each other, and get away from each other. Thus, it is possible to grip the object W with the finger parts 14, 15, and to release the object W having once been gripped. It should be noted that the robot hand 10 can be provided with a configuration in which either one of the finger parts 14, 15 is moved, and the other is fixed.

The finger parts 14, 15 are each provided with the piezoelectric sensor 1. The piezoelectric sensors 1 are respectively disposed on surfaces opposed to each other in the finger parts 14, 15, namely gripping surfaces 141, 151. When pinching the object W between the gripping surface 141 and the gripping surface 151, the piezoelectric sensors 1 respectively intervene between the gripping surfaces 141, 151 and the object W. Therefore, each of the piezoelectric sensors 1 receives reactive force from the object W, and then outputs a voltage corresponding to the reactive force. Thus, the robot hand 10 has a function of detecting a state of the gripping of the object W based on the output voltages from the piezoelectric sensors 1. It should be noted that the piezoelectric sensor 1 can be provided to just one of the finger parts 14, 15.

The robot hand 10 is hereinabove described, but the piezoelectric sensor 1 can be used in a variety of devices other than the robot hand 10 such as a haptic sensor, a gaming controller, a teleoperation controller, an MR (mixed reality) controller, a user interface having flexibility, and a variety of ON/OFF sensors.

2. Piezoelectric Sensor According To First Embodiment

Then, the piezoelectric sensor according to the first embodiment will be described.

Figure 2:
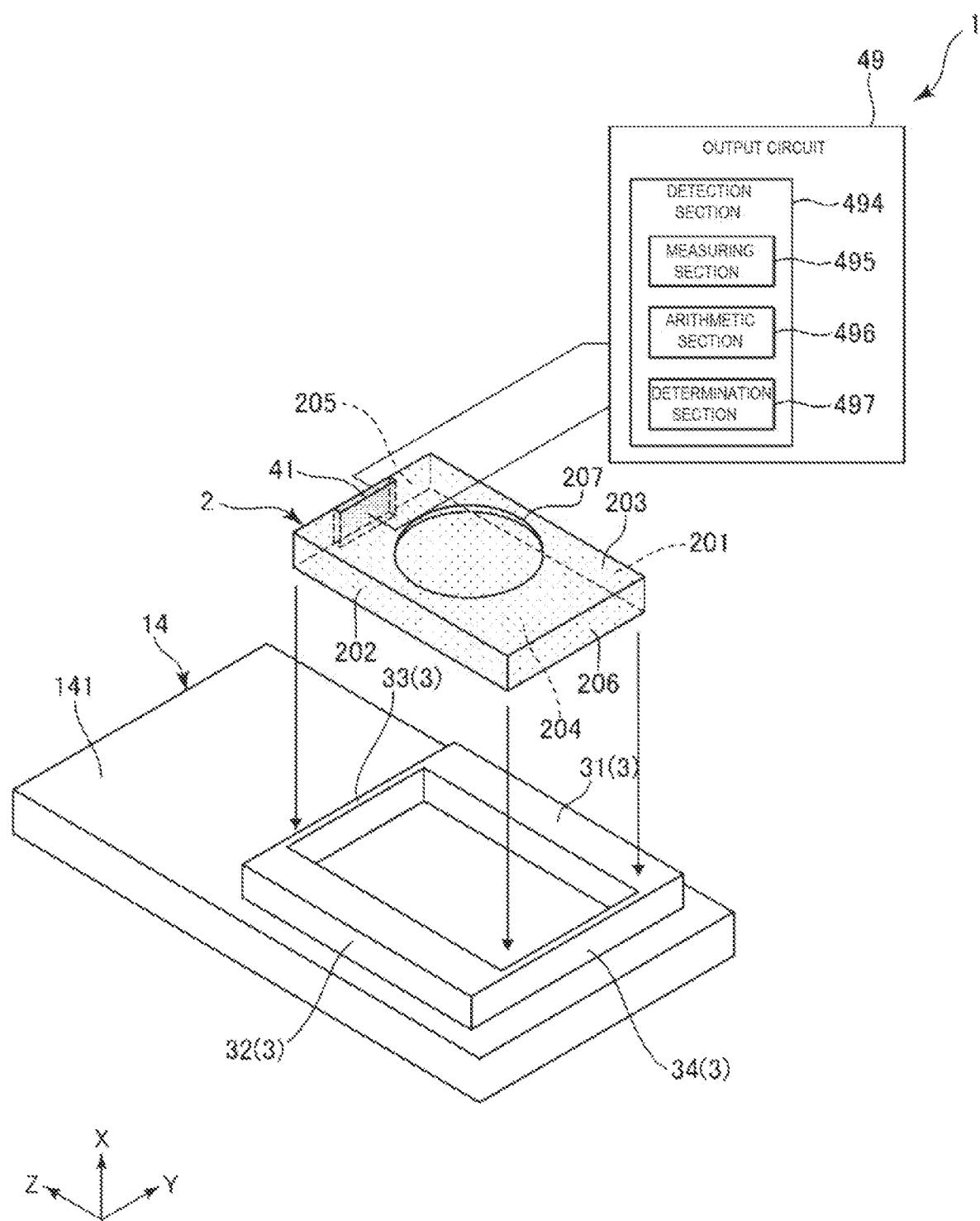
FIG. 2 is a perspective view showing a tip of a finger part shown in FIG. 1 in an enlarged manner, and is a perspective view showing the piezoelectric sensor according to a first embodiment in an exploded manner.
Figure 3:
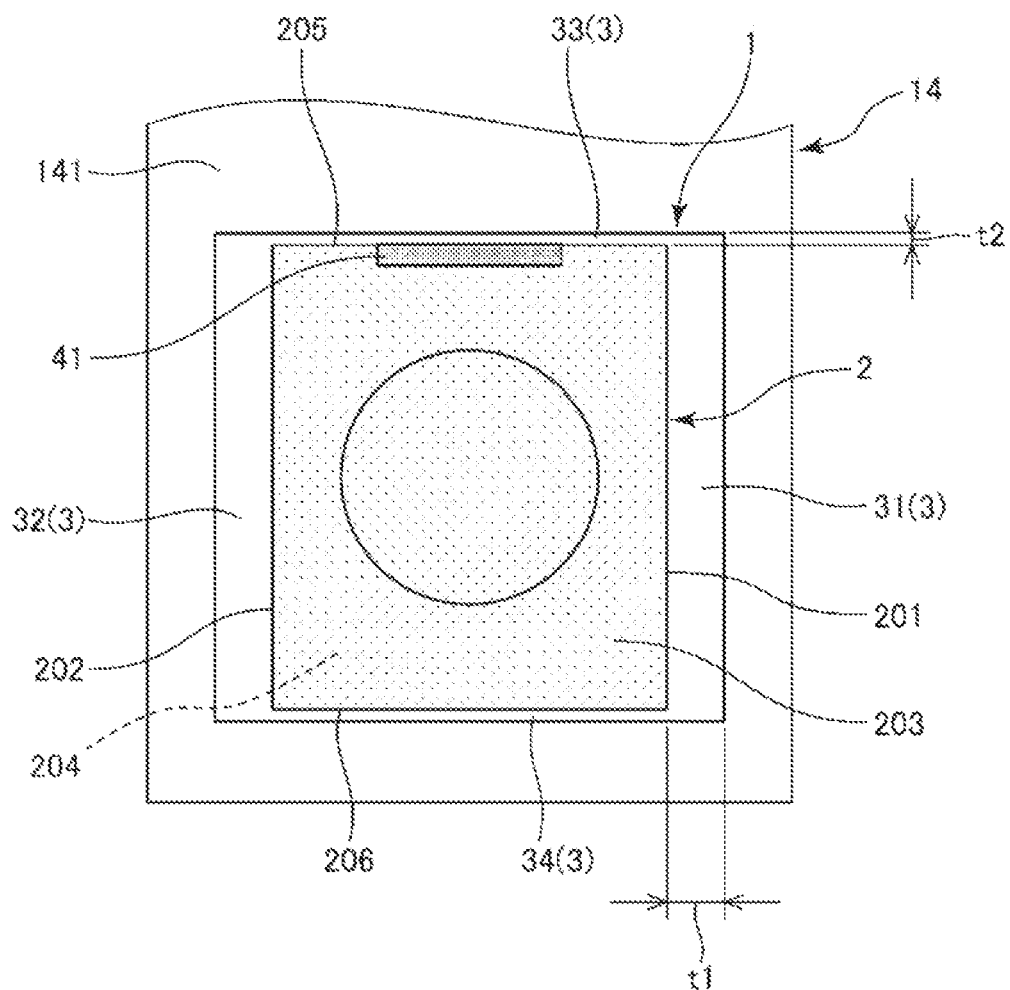
FIG. 3 is a plan view of the piezoelectric sensor shown in FIG. 2 when viewed from a position on an X axis.

FIG. 2 is a perspective view showing a tip of the finger part 14 shown in FIG. 1 in an enlarged manner, and is a perspective view showing the piezoelectric sensor 1 according to the first embodiment in an exploded manner. FIG. 3 is a plan view of the piezoelectric sensor 1 shown in FIG. 2 when viewed from a position on the X axis.

The piezoelectric sensor 1 shown in FIG. 2 and FIG. 3 is attached to the gripping surface 141 of the finger part 14. The piezoelectric sensor 1 is provided with an elastic body 2, a regulatory section 3, a piezoelectric element 41, and an output circuit 49 having a detector 494.

The elastic body 2 has elasticity, and is disposed so as to have contact with the gripping surface 141. It should be noted that an arbitrary object can intervene between the elastic body 2 and the gripping surface 141. The elasticity means a property of deforming in accordance with force when the force is applied, and being restored to an original shape when the force is removed. Therefore, when force is applied to the elastic body 2, the elastic body 2 deforms, and the force propagates to every part of the elastic body 2.

The elastic body 2 shown in FIG. 2 and FIG. 3 is shaped like a plate spreading in a Y-Z plane, and has six surfaces. Out of the six surfaces, the two surfaces crossing the Y axis are defined as a first surface 201 and a second surface 202, the two surfaces crossing the X axis are defined as a third surface 203 and a fourth surface 204, and the two surfaces crossing the Z axis are defined as a fifth surface 205 and a sixth surface 206.

The third surface 203 and the fourth surface 204 are principal surfaces having an obverse-reverse relationship with each other in the elastic body 2. The third surface 203 is a surface facing the object W, and the fourth surface 204 is fixed to the gripping surface 141. The third surface 203 and the fourth surface 204 shown in FIG. 3 each have a rectangular shape. Further, in the elastic body 2 shown in FIG. 2, a central portion of the third surface 203 forms a convexly curved surface 207. Thus, when the third surface 203 makes contact with the object W, the convexly curved surface 207 can preferentially make contact therewith. As a result, when force is applied to the elastic body 2, it is possible to propagate the force from the central portion of the third surface 203 toward the circumferential edge portion.

As a constituent material of the elastic body 2, there can be cited, for example, rubber, elastomer, and foamed resin. Among the above, as the rubber, there can be cited, for example, polyisobutylene, polyisoprene, chloroprene rubber, butyl rubber, silicone rubber, fluorine-contained rubber, acrylic rubber, polyurethane rubber, ethylene-propylene rubber, butadiene rubber, acrylonitrile-butadiene rubber, and styrene-butadiene rubber.

The regulatory section 3 shown in FIG. 2 and FIG. 3 is disposed on the gripping surface 141, and shaped like a frame surrounding the elastic body 2. An inner side surface of the regulatory section 3 has contact with an outer side surface of the elastic body 2. In other words, when making a plan view of the third surface 203 of the elastic body 2, the elastic body 2 fits into the inside of the regulatory section 3. It should be noted that some gap can exist between the regulatory section 3 and the elastic body 2. Further, an arbitrary object can intervene between the regulatory section 3 and the gripping surface 141.

The regulatory section 3 has a first wall part 31 and a second wall part 32 extending along the Z axis, and a third wall part 33 and a fourth wall part 34 extending along the Y axis.

The thickness t1 of each of the first and second wall parts 31, 32 is made thicker than the thickness t2 of the third and fourth wall parts 33, 34. Thus, the first and second wall parts 31, 32 become higher in bending rigidity than the third and fourth wall parts 33, 34. As a result, the first and second wall parts 31, 32 become difficult to deform when being pressed by the elastic body 2. Specifically, the first wall part 31 and the second wall part 32 respectively face the first surface 201 and the second surface 202 of the elastic body 2 in an natural state. Specifically, the first wall part 31 and the second wall part 32 have contact with the first surface 201 and the second surface 202 of the elastic body 2, or are adjacent thereto via a slight gap. Therefore, when the elastic body 2 receives force to be urged to make a deformation in the Y-axis direction, the deformation is limited. It should be noted that the thickness of the first and second wall parts 31, 32 means a length in the Y-axis direction.

The third and fourth wall parts 33, 34 are made thinner in thickness than the first and second wall parts 31, 32. Thus, the third and fourth wall parts 33, 34 become lower in bending rigidity than the first and second wall parts 31, 32. As a result, the third and fourth wall parts 33, 34 become easy to deform when being pressed by the elastic body 2. In other words, the third and fourth wall parts 33, 34 have contact with the elastic body 2 in the natural state, or are adjacent to the elastic body 2 in the natural state with a slight gap. Therefore, when the elastic body 2 receives force to be urged to deform in the Z-axis direction, the third and fourth wall parts 33, 34 are also displaced along the Z axis due to the deformation of the elastic body 2. In other words, a bending deformation toward the Z-axis direction occurs in the third and fourth wall parts 33, 34. On this occasion, both ends in the Y-axis direction of the third and fourth wall parts 33, 34 are coupled to the first and second wall parts 31, 32, and are therefore hardly displaced. It should be noted that the thickness of the third and fourth wall parts 33, 34 means a length in the Z-axis direction.

A constituent material of the regulatory section 3 is not particularly limited, but there can be cited, for example, a resin material, a ceramics material, and a metal material.

The thickness of the first and second wall parts 31, 32 is arbitrarily set in accordance with the constituent material, but is preferably no smaller than 0.5 mm and no larger than 20 mm, as an example, and is more preferably no smaller than 1 mm and no larger than 10 mm. Thus, the first and second wall parts 31, 32 have sufficient bending rigidity, and become difficult to particularly deform even when force is applied to the elastic body 2.

The thickness of the third and fourth wall parts 33, 34 is arbitrarily set in accordance with the constituent material, but is preferably no higher than 60% of the thickness of the first and second wall parts 31, 32, as an example, and is more preferably no lower than 5% and no higher than 40%. Thus, the third and fourth wall parts 33, 34 have sufficient flexibility, and when force is applied to the elastic body 2, the third and fourth wall parts 33, 34 easily deform in accordance with the force. Therefore, it becomes easy to transfer the deformation to the piezoelectric element 41, and thus, it is possible to increase the sensitivity of the piezoelectric sensor 1.

Although not shown in the drawings, the piezoelectric element 41 is provided with a piezoelectric body, and a pair of electrodes disposed via the piezoelectric body. The piezoelectric body generates a voltage between the electrodes due to the piezoelectric effect when the piezoelectric body makes, for example, a bending deformation. By detecting the voltage output from the piezoelectric element 41, a direction and a magnitude of the force thus received are identified.

The piezoelectric element 41 shown in FIG. 2 is disposed between the fifth surface 205 of the elastic body 2 and the third wall part 33. Further, when the bending deformation occurs in the third wall part 33 due to the deformation of the elastic body 2, a bending deformation also occurs similarly in the piezoelectric element 41. By the piezoelectric element 41 being partially fixed to the third wall part 33 in such a manner, it is possible to prevent damage from occurring in the piezoelectric element 41 due to the bending deformation. In other words, by the third wall part 33 reinforcing the piezoelectric element 41, it becomes difficult for a piezoelectric property of the piezoelectric element 41 to deteriorate even when the bending deformation repeatedly occurs in the piezoelectric element 41 with a short period. Further, when unloaded, it becomes easy for the piezoelectric element 41 to be restored to the original shape. In other words, followability of the piezoelectric element 41 with respect to the deformation of the elastic body 2 is enhanced. Thus, it is possible to suppress the deterioration of accuracy of force detection.

As the piezoelectric material constituting the piezoelectric body, there can be cited, for example, piezoelectric ceramics such as lead titanate zirconate (PZT), barium titanate, and lead titanate, and piezoelectric plastic such as polyvinylidene fluoride and polylactate.

It should be noted that the piezoelectric body has anisotropy in the piezoelectric effect in accordance with a piezoelectric constant provided to the piezoelectric material. In the present embodiment, the piezoelectric material is selected so that a voltage is generated between the electrodes in accordance with the bending deformation which occurs in the Z-axis direction. Thus, the direction and the magnitude of the force received by the elastic body 2 can be identified in accordance with the output from the piezoelectric element 41. As the piezoelectric constant representing such piezoelectric property, there can be cited, for example, $d_{31}$.

As the constituent material of the electrodes, there can be cited, for example, simple body or alloys of Al, Cu, Ni, Ag, and Au.

Figure 4:
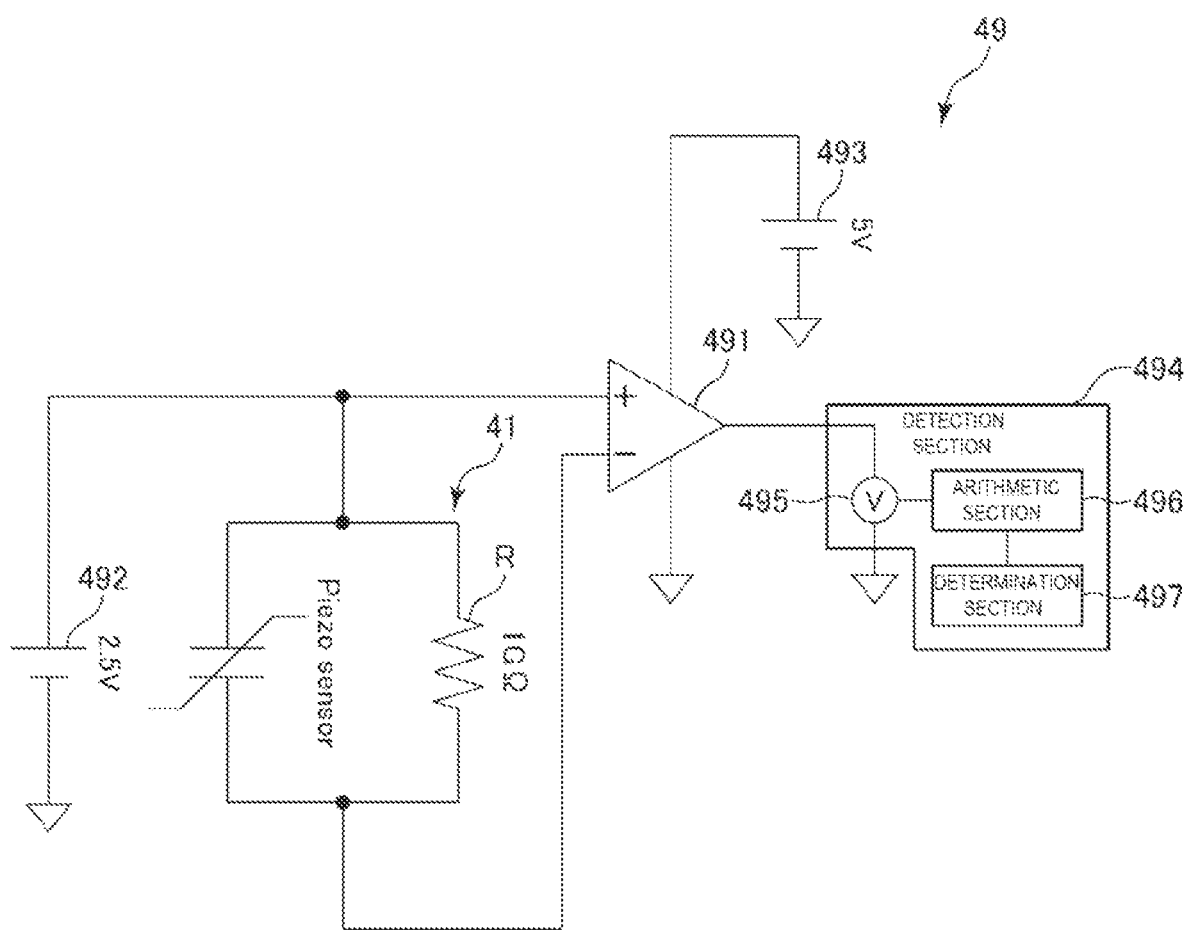
FIG. 4 is a diagram showing an example of an output circuit for amplifying a voltage generated in a piezoelectric element.

FIG. 4 shows an example of an output circuit for amplifying the voltage generated in the piezoelectric element 41.

An output circuit 49 shown in FIG. 4 is provided with an amplifier 491, a power supply 492, a power supply 493, and the detector 494. The piezoelectric element 41 is coupled between an inverting input terminal and a non-inverting input terminal of the amplifier 491. The power supply 492 is coupled to the non-inverting input terminal. The power supply 493 is coupled to a power supply terminal of the amplifier 491. The detector 494 is coupled to an output terminal of the amplifier 491.

Such an output circuit 49 amplifies the voltage generated in the piezoelectric element 41, and outputs the result as a voltage signal large in amplitude. It should be noted that as shown in FIG. 4, when the power supply 492 is coupled to the input terminal of the amplifier 491, an offset is applied to an input signal by the power supply 492. Therefore, a voltage provided with the offset, namely a voltage signal which increases and decreases based on the reference voltage, is output to the detector 494 as a result. It should be noted that the power supply 492 is only required to be provided as needed, and can also be eliminated.

The detector 494 has a function of detecting a temporal variation of the voltage signal which increases and decreases based on the reference voltage, a function of determining presence or absence of the slippage between the object W and the piezoelectric sensor 1 based on the voltage value, and so on. As an example, the detector 494 shown in FIG. 2 and FIG. 4 has a measuring section 495, an arithmetic section 496, and a determination section 497. The measuring section 495 measures the amplitude of the voltage signal output from the amplifier 491. The arithmetic section 496 calculates an increase-decrease value of the amplitude of the voltage signal with respect to the reference voltage. The determination section 497 performs, for example, a comparison between a calculation result by the arithmetic section 496 and an allowable range set in advance, and then outputs the result.

At least a part of the detector 494 is constituted by hardware provided with a processor, a memory, an external interface, and so on. As the processor, there can be cited, for example, a CPU (Central Processing Unit). By the processor retrieving and then executing a program stored in the memory, the function of the detector 494 is realized. It should be noted that the hardware configuration is not limited thereto, and it is possible to adopt a configuration provided with an LSI (Large Scale Integration), an ASIC (Application Specific Integrated Circuit), an FPGA (Field-Programmable Gate Array), and so on.

Further, a circuit configuration of the output circuit provided to the piezoelectric sensor 1 is not limited to the circuit configuration shown in FIG. 4, and the output circuit can be, for example, a circuit including a charge amplifier.

Figure 6:
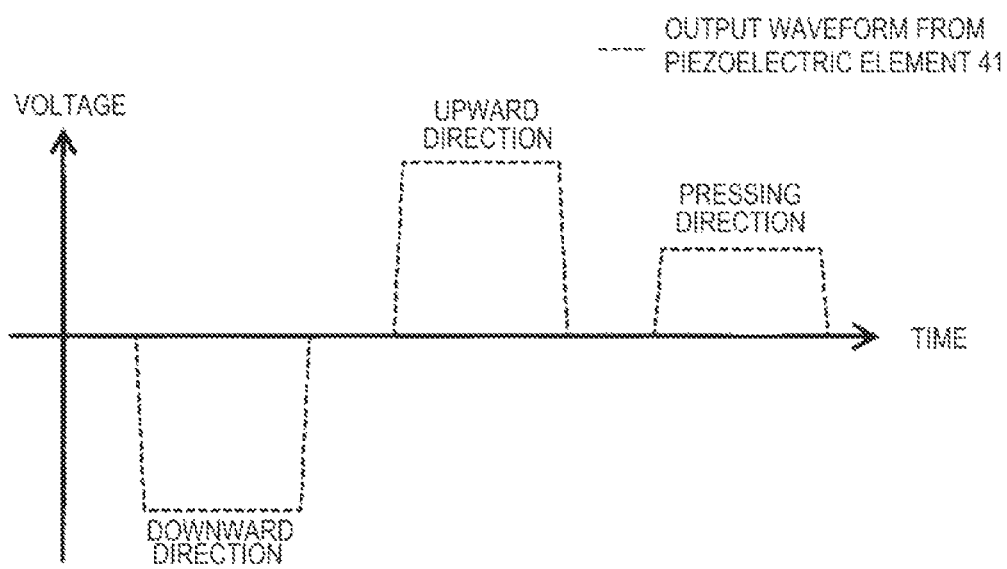
FIG. 6 is a diagram showing an example of a waveform (an output waveform) of a voltage signal output from the piezoelectric element shown in FIG. 3 when the elastic body has deformed in the deformation mode shown in FIG. 5.

FIG. 5 is a diagram for explaining a deformation mode of the elastic body 2 when force is applied from a variety of directions to the piezoelectric sensor 1 shown in FIG. 3. FIG. 6 is a diagram showing an example of a waveform (an output waveform) of the voltage signal output from the piezoelectric element 41 shown in FIG. 3 when the elastic body 2 has deformed in the deformation mode shown in FIG. 5. It should be noted that in the example shown in FIG. 6, there is shown a waveform of a relative potential to the reference voltage.

When no force is applied to the piezoelectric sensor 1, since the elastic body 2 keeps the natural state, the piezoelectric element 41 does not deform as shown in an upper left diagram in FIG. 5. Therefore, theoretically, no voltage is generated in the piezoelectric element 41.

When downward force is applied to the piezoelectric sensor 1, downward pulling force is applied to the third surface 203 of the elastic body 2 as indicated by an arrow in an upper right diagram in FIG. 5. Then, the elastic body 2 deforms so as to be drawn downward, and accordingly, a downward bending deformation occurs in the piezoelectric element 41. On this occasion, a negative voltage signal with respect to the reference voltage, for example, is output from the piezoelectric element 41 as shown in FIG. 6. In other words, there is output a voltage signal which decreases from the reference voltage. Thus, it is possible to identify the fact that the downward force is applied to the piezoelectric sensor 1. It should be noted that an output direction of the voltage signal with respect to the reference voltage is decided in accordance with a polarization direction of the piezoelectric element and a circuit configuration, and can therefore be opposite to the above. In that case, an opposite result is obtained in the subsequent outputs.

It should be noted that when the robot hand 10 is moved while gripping the object W with the robot hand 10 to hold the object W in the air, such downward force is applied to the piezoelectric sensor 1 due to the weight of the object W. Therefore, the state in which the robot hand 10 lifts the object W can be identified based on the output waveform from the piezoelectric element 41.

When upward force is applied to the piezoelectric sensor 1, upward pulling force is applied to the third surface 203 of the elastic body 2 as indicated by an arrow in a lower left diagram in FIG. 5. Then, the elastic body 2 deforms so as to be drawn upward, and accordingly, an upward bending deformation occurs in the piezoelectric element 41. On this occasion, a positive voltage signal with respect to the reference voltage, for example, is output from the piezoelectric element 41 as shown in FIG. 6. In other words, there is output a voltage signal which increases from the reference voltage. Thus, it is possible to identify the fact that the upward force is applied to the piezoelectric sensor 1.

It should be noted that when the robot hand 10 is moved while gripping the object W with the robot hand 10 to press a lower surface of the object W against a body, such upward force is applied to the piezoelectric sensor 1. Therefore, the state in which the robot hand 10 presses the object W against the body can be identified based on the output waveform from the piezoelectric element 41.

When force in a pressing direction, namely force of pressing the elastic body 2 shown in FIG. 5 from the positive side in the X axis toward the negative side in the X axis, is applied to the piezoelectric sensor 1, a deformation of stretching in the vertical direction occurs in the third surface 203 of the elastic body 2 as indicated by an arrow in a lower right diagram in FIG. 5. Then, the elastic body 2 stretches in the vertical direction, and accordingly, an upward bending deformation occurs in the piezoelectric element 41. It should be noted that the deformation amount of the bending deformation becomes smaller compared to when applying the upward force described above. Therefore, a positive voltage signal relatively smaller in voltage value with respect to the reference voltage, for example, is output from the piezoelectric element 41 as shown in FIG. 6. Thus, it is possible to identify the fact that the force in the pressing direction is applied to the piezoelectric sensor 1.

It should be noted that when gripping the object W with the robot hand 10, the reactive force from the object W presses the piezoelectric sensor 1 against the gripping surface 141. Therefore, the state in which the robot hand 10 grips the object W can be identified based on the output waveform from the piezoelectric element 41.

An example of the deformation mode is hereinabove described, but the deformation direction such as the upward direction and the downward direction can be other directions.

Here, there is assumed when the robot hand 10 firmly presses the object W gripped by the robot hand 10 against, for example, a floor surface. In this case, the upward arrow shown in FIG. 5 corresponds to the direction of the reactive force applied to the object W from the floor surface when the robot hand 10 presses the object W against the floor surface. The reactive force acts as deformation force for deforming the elastic body 2. Since the bending deformation occurs in the piezoelectric element 41 due to the deformation of the elastic body 2, it is possible to detect the direction and the magnitude (bending radius) of the bending deformation.

Meanwhile, between the object W and the elastic body 2, there is generated frictional force. When the deformation force and the frictional force are in a balanced state, a positional relationship between the object W and the robot hand 10 is maintained. On this occasion, no slippage occurs between the object W and the piezoelectric sensor 1.

Subsequently, when moving the whole of the robot hand 10 downward, the force of pressing the object W against the floor surface gradually increases. Then, when the deformation force exceeds the frictional force, slippage occurs between the object W and the elastic body 2. The frictional force acting immediately before the slippage occurs is defined as "static frictional force." Since the frictional force acting immediately before the slippage occurs is equal to the deformation force, the static frictional force can be detected by the piezoelectric element 41. When the slippage occurs, the frictional force becomes lower than the static frictional force. The frictional force acting when the slippage is in progress is defined as "kinetic frictional force." Since the kinetic frictional force is weaker than the static frictional force, when the static frictional force occurs and when the kinetic frictional force occurs can be distinguished from each other based on the voltage signal output from the piezoelectric element 41. Further, since the frictional force acting when the slippage is in progress balances with the deformation force, the kinetic frictional force can be detected by the piezoelectric element 41. Further, since the kinetic frictional force is continuously detected during the occurrence of the slippage, the output waveform from the piezoelectric element 41 becomes a waveform including a peak corresponding to the static frictional force, and a voltage value corresponding to the kinetic frictional force subsequently observed.

Figure 7:
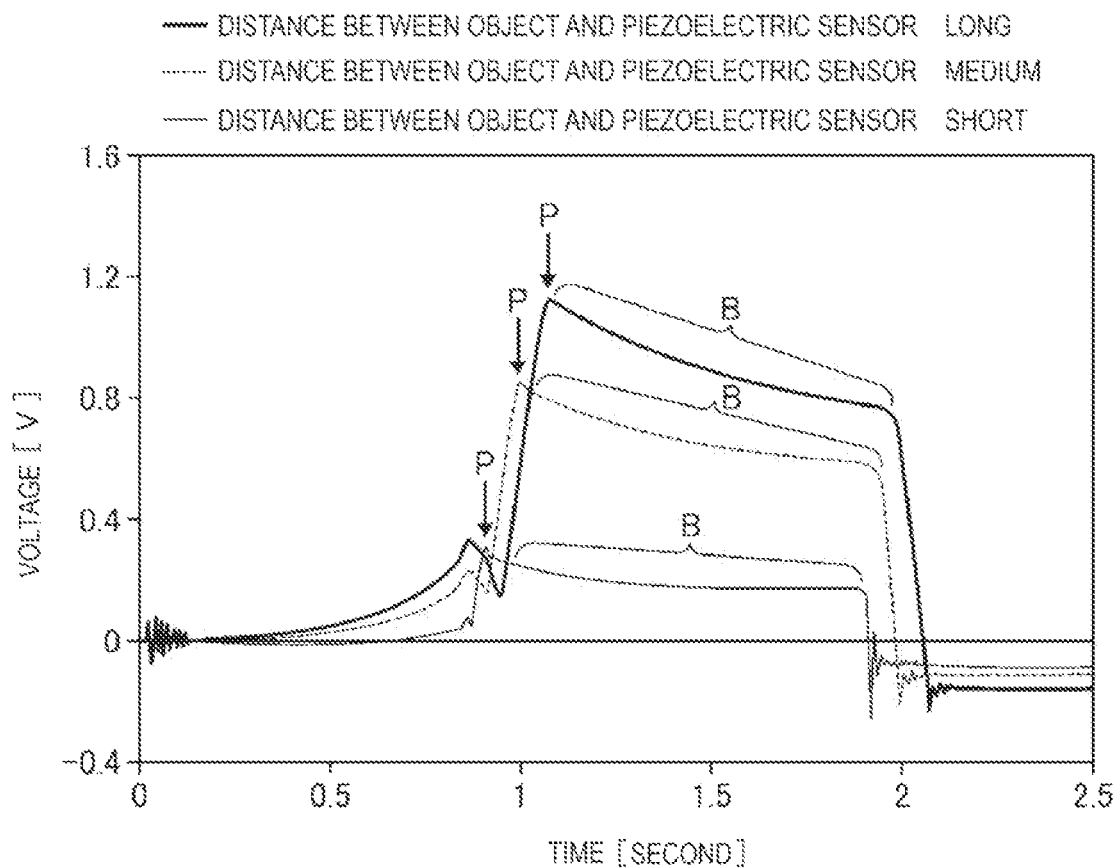
FIG. 7 is a diagram showing an example of an output waveform from the piezoelectric element when slippage occurs between an object and the elastic body.

FIG. 7 is a diagram showing an example of the output waveform from the piezoelectric element 41 when the slippage occurs between the object W and the elastic body 2. In FIG. 7, the horizontal axis represents time, and the vertical axis represents the output voltage from the piezoelectric element 41. Further, in FIG. 7, the output waveforms obtained when varying the gripping force of the object W, namely a distance between the piezoelectric sensor 1 and the object W, at three levels are shown in an overlapped manner.

The output waveform shown in FIG. 7 includes a peak P which appears immediately after a significant voltage value is observed, and a region B which is subsequently observed, and in which the voltage value is kept lower than the peak P.

The peak P corresponds to the bending deformation which occurs in the piezoelectric element 41 when the static frictional force acts. Further, the region B corresponds to the bending deformation which occurs in the piezoelectric element 41 when the kinetic frictional force acts. As described above, since the kinetic frictional force is weaker than the static frictional force, the region B is lower than the peak P. Therefore, when the region B is detected after the detection of the peak P, it is possible to determine that the slippage has occurred between the object W and the elastic body 2. In other words, it is possible for the piezoelectric sensor 1 to detect the kinetic frictional force corresponding to the region B based on the existence of the peak P and the region B, and then detect presence or absence of the slippage based thereon.

Figure 8:
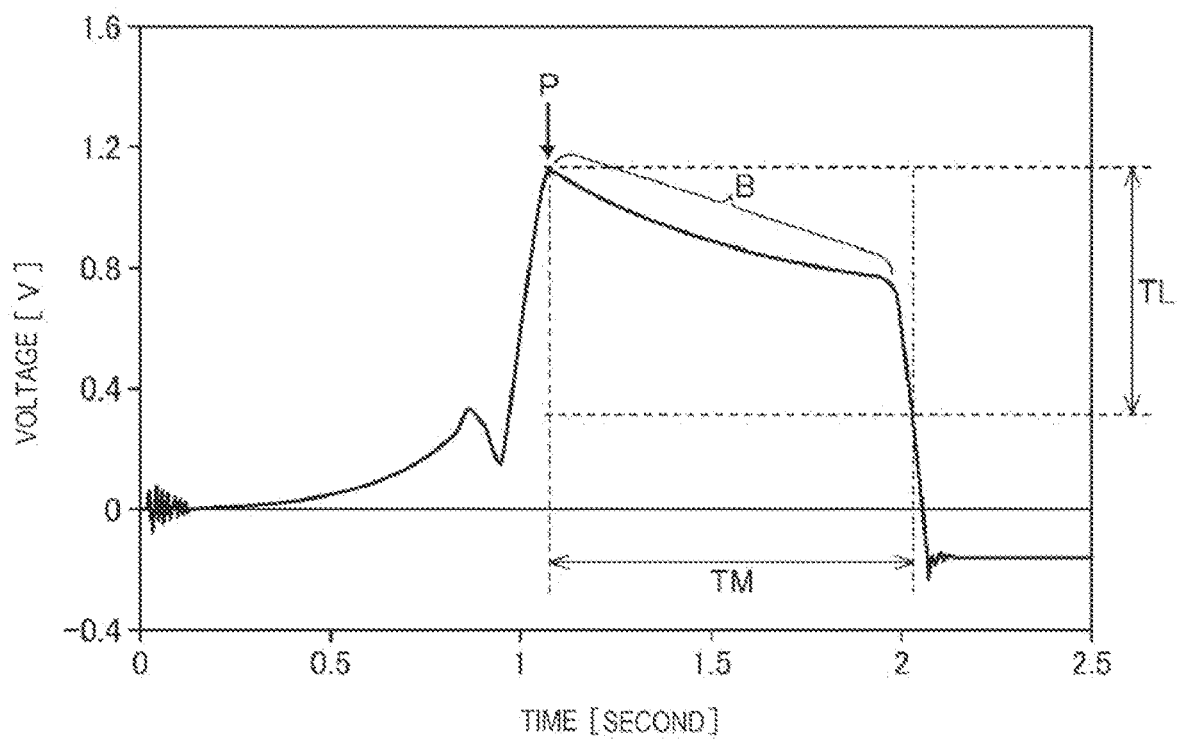
FIG. 8 is a diagram extracting one of the three output waveforms shown in FIG. 7.

FIG. 8 is a diagram extracting one of the three output waveforms shown in FIG. 7. When determining presence or absence of the slippage, the determination section 497 provided to the detector 494 first detects the peak P. The peak P takes a local maximum value, and can therefore be identified based on, for example, presence or absence of the local maximum value. Then, the determination section 497 sets an allowable range TL based on the height of the peak P. The allowable range TL is, for example, preferably set to a range no lower than 20% and lower than 100% of the height of the peak P, and more preferably set to a range no lower than 40% and lower than 100%. Then, it is possible for the determination section 497 to determine the presence or absence of the slippage based on the time TM in which the region B continuously falls within the allowable range TL. The time TM is arbitrarily set in accordance with a type of the object W, a size of the elastic body 2, a level of a noise, and so on, and is preferably no shorter than 0.1 second, and is more preferably no shorter than 0.5 second as an example. It should be noted that the process of the determination is not limited to the above.

In such a manner as described hereinabove, it is possible to detect the presence or absence of the slippage. Thus, when the robot hand 10 performs the operation of pressing the object W gripped by the robot hand 10 against, for example, the floor surface, a precursor that the object W drops from the robot hand 10 can be caught via the piezoelectric sensor 1. As a result, it is possible to change the operation of the robot hand 10 before the object W drops. In other words, it is possible to make the robot hand 10 perform an avoidance operation for preventing the object W from dropping.

It should be noted that the detection of the presence or absence of the slippage described above does not depend on the gripping force of the object W. In FIG. 7, there are shown the output waveforms when changing the level of the gripping force at the three levels as described above, even when changing the gripping force, the peak P and the region B are recognized in each of the output waveforms.

Further, such detection of the presence or absence of the slippage as described above does not depend on a relative speed at which the slippage occurs between the object W and the elastic body 2. Although not shown in the drawings, even when the relative speed varies, the peak P and the region B are recognized in the output waveform from the piezoelectric element 41.

Further, the object W is not limited to a body which can be gripped and is shown in FIG. 1. For example, it is possible to obtain such an output waveform as shown in FIG. 7 when the piezoelectric sensor 1 is made to have direct contact with the floor surface as the object, and is then moved along the floor surface. In this case, it is possible to detect the static frictional force and the kinetic frictional force generated between the floor surface and the elastic body 2, and thus, it is possible to detect the presence or absence of the slippage based thereon. Further, when the floor surface has asperity, a variation due to the asperity occurs in the output waveform.

Figure 9:
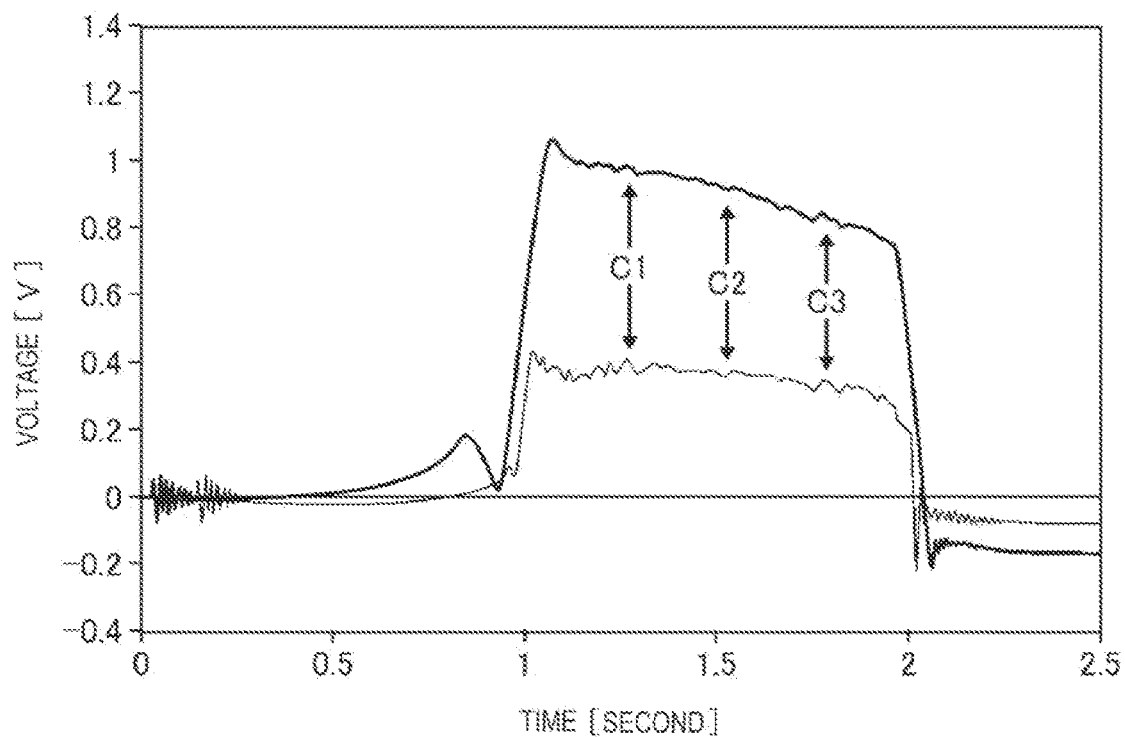
FIG. 9 is a diagram showing an example of the output waveform from the piezoelectric element when moving the piezoelectric sensor along a floor surface having asperity.

FIG. 9 is a diagram showing an example of the output waveform from the piezoelectric element 41 when moving the piezoelectric sensor 1 along the floor surface having the asperity. In FIG. 9, the horizontal axis represents time, and the vertical axis represents the output voltage from the piezoelectric element 41. Further, in FIG. 9, the output waveforms obtained when varying a distance between the floor surface and the piezoelectric sensor 1, namely the force which the piezoelectric sensor 1 receives from the floor surface, at two levels are shown in an overlapped manner.

The output waveforms shown in FIG. 9 also include the peak P and the region B in which the voltage value is kept lower than the peak P. Therefore, based on the output waveforms shown in FIG. 9, it is possible to detect the presence or absence of the slippage with the piezoelectric sensor 1 with respect to the body such as the floor surface which is not gripped.

Further, the output waveforms shown in FIG. 9 reflects the asperity provided to the floor surface. Changing points C1, C2, and C3 shown in FIG. 9 are recognized commonly to the two output waveforms. Times when the changing points C1, C2, and C3 are respectively observed correspond to times when the piezoelectric sensor 1 passes the asperity provided to the floor surface. Therefore, it is possible for the piezoelectric sensor 1 to catch not only the presence or absence of the slippage, but also the change in shape such as the asperity existing on the surface of the object W. In other words, the piezoelectric sensor 1 makes it possible to indirectly catch the asperity based on the change in the kinetic frictional force acting when the piezoelectric sensor 1 passes the asperity.

As described hereinabove, the piezoelectric sensor 1 according to the present embodiment is provided with the elastic body 2, the piezoelectric element 41, and the detector 494. The piezoelectric element 41 is arranged at the position where the piezoelectric element 41 has contact with the elastic body 2, and outputs the voltage signal when deforming due to the deformation of the elastic body 2. The deformation of the piezoelectric element 41 means a change in shape of the piezoelectric element 41 from when the elastic body 2 does not deform. Then, when the elastic body 2 moves relatively to the object W after the elastic body 2 makes contact with the object W, the detector 494 detects the kinetic frictional force generated between the object W and the elastic body 2 based on the variation of the voltage signal caused by the relative movement of the object W.

According to such a piezoelectric sensor 1, it is possible to detect the kinetic frictional force generated between the object W and the elastic body 2. Specifically, when the elastic body 2 deforms following the object W, since it is possible for the piezoelectric element 41 to catch the variation in deformation amount, it is possible to separately detect the static frictional force and the kinetic frictional force. Thus, it becomes possible to detect the kinetic frictional force, and the presence or absence of the slippage which occurs between the object W and the elastic body 2 can be detected based on the comparison with the static frictional force. As a result, it is possible to realize the robot hand 10 capable of easily identifying whether to stably grip, for example, the object W.

Further, since the force is transferred to the piezoelectric element 41 via the elastic body 2, it is possible to prevent an impact from being directly applied to the piezoelectric element 41. Thus, it becomes difficult to damage the piezoelectric element 41.

Further, the robot hand 10 according to the embodiment described above is provided with such a piezoelectric sensor 1 as described above.

When using the piezoelectric sensor 1 to such a robot hand 10 as shown in FIG. 1, it is possible to realize the robot hand 10 capable of detecting not only the fact that, for example, the object W is gripped, but also the presence or absence of the slippage occurring between the object W thus gripped and the elastic body 2. Further, in the robot hand 10 provided with the piezoelectric sensor 1 described above, it becomes possible to identify, for example, the state in which the object W is lifted, and the state in which the object W is pressed against a body in addition to the fact that the object W is gripped. Further, the piezoelectric sensor 1 is provided with a structure of making the elastic body 2 have contact with the object W. Thus, since it is difficult to generate a major impact even when the piezoelectric sensor 1 makes contact with the object W, it is possible to grip the object W with the robot hand 10 without breaking the object W even when the rigidity of the object W is low. Further, it is possible to prevent the damage of the piezoelectric element 41 due to the impact. It should be noted that it is possible for the robot hand 10 to be provided with a piezoelectric sensor according to each of embodiments described later.

Further, in the piezoelectric sensor 1 according to the present embodiment, when the elastic body 2 makes contact with the object W, the detector 494 detects the static frictional force generated between the object W and the elastic body 2 based on the voltage signal output from the piezoelectric element 41.

According to such a piezoelectric sensor 1, it is possible to effectively generate the static frictional force difficult to break between the object W and the elastic body 2 using the elasticity of the elastic body 2. Therefore, it is possible to stably detect the static frictional force based on the voltage signal output from the piezoelectric element 41 irrespective of the surface state of the object W.

Further, in the piezoelectric sensor 1 according to the present embodiment, the elastic body 2 has the first surface 201 as described above. Further, the piezoelectric sensor 1 is provided with the regulatory section 3 which is disposed at a position where the regulatory section 3 faces the first surface 201 of the elastic body 2 to limit the deformation of the elastic body 2. Further, the piezoelectric element 41 is partially fixed to the regulatory section 3.

According to such a configuration, it is possible to detect the direction of the applied force when the force is applied to the elastic body 2 in a plurality of directions different from each other such as the upward direction, the downward direction, and the pressing direction. Thus, in the robot hand 10 provided with the piezoelectric sensor 1, it is possible to identify, for example, the state in which the object W is lifted, and the state in which the object W is pressed against a body in addition to the fact that the object W is gripped. Therefore, it is possible to appropriately operate the robot hand 10 in accordance with these states different from each other, and thus, it is possible to enhance the convenience.

Further, in the piezoelectric sensor 1 according to the present embodiment, the elastic body 2 has the second surface 202 opposed to the first surface 201. Further, the regulatory section 3 is provided with the first and second wall parts 31, 32 and the third and fourth wall parts 33, 34. The first and second wall parts 31, 32 are arranged at the positions where the first and second wall parts 31, 32 face the first surface 201 and the second surface 202, respectively. The third and fourth wall parts 33, 34 couple the first wall part 31 and the second wall part 32 to each other, and are thinner in thickness than the first and second wall parts 31, 32. Further, the piezoelectric element 41 is fixed to the second wall part 33.

According to such a configuration, since the piezoelectric element 41 is fixed to the third wall part 33, the durability of the piezoelectric element 41 increases, and at the same time, the followability of the piezoelectric element 41 to the deformation of the elastic body 2 is enhanced.

Further, the elastic body 2 has the third surface 203 having a rectangular shape. Further, the elastic body 2 is shaped like a plate having the third surface 203 as the principal surface.

According to such a configuration, since the third surface 203 relatively large in area faces the object W, it is possible to ensure the large contact area between the object W and the elastic body 2. Thus, it is possible to apply strong force to the elastic body 2, and the displacement of the fifth surface 205 on which the piezoelectric element 41 is exposed becomes large. As a result, it is possible to further increase the sensitivity of the piezoelectric sensor 1.

It should be noted that the shape of the third surface 203 is not limited to the rectangular shape, and can also be other shapes such as a square shape or a polygonal shape. Further, it is possible to adopt a shape with rounded corners and a shape with chamfered corners.

Further, as shown in FIG. 2, the elastic body 2 has the convexly curved surface 207 as the contact surface which makes contact with the object W. The convexly curved surface 207 is disposed at a position at a distance from the piezoelectric element 41.

According to such a configuration, even when the convexly curved surface 207 makes contact with the object W, it is possible to avoid the contact between the piezoelectric element 41 and the object W. Thus, it is possible to prevent the damage from occurring in the piezoelectric element 41. Further, since the elastic body 2 has the elasticity, even when arranging the piezoelectric element 41 at a position located at a distance from the convexly curved surface 207, the frictional force generated between the elastic body 2 and the object W is converted into the deformation of the piezoelectric element 41 in good condition. Therefore, it is possible to efficiently detect the frictional force in the piezoelectric element 41. As a result, there is realized the piezoelectric sensor 1 excellent in sensitivity.

It should be noted that it is possible for the elastic body 2 to have a protruding surface having an arbitrary shape instead of the convexly curved surface 207, but when adopting the convexly curved surface 207, the piezoelectric sensor 1 which detects force applied from a variety of directions in good condition is easily realized.

3. Piezoelectric Sensor According To Second Embodiment

Then, a piezoelectric sensor according to a second embodiment will be described.

Figure 10:
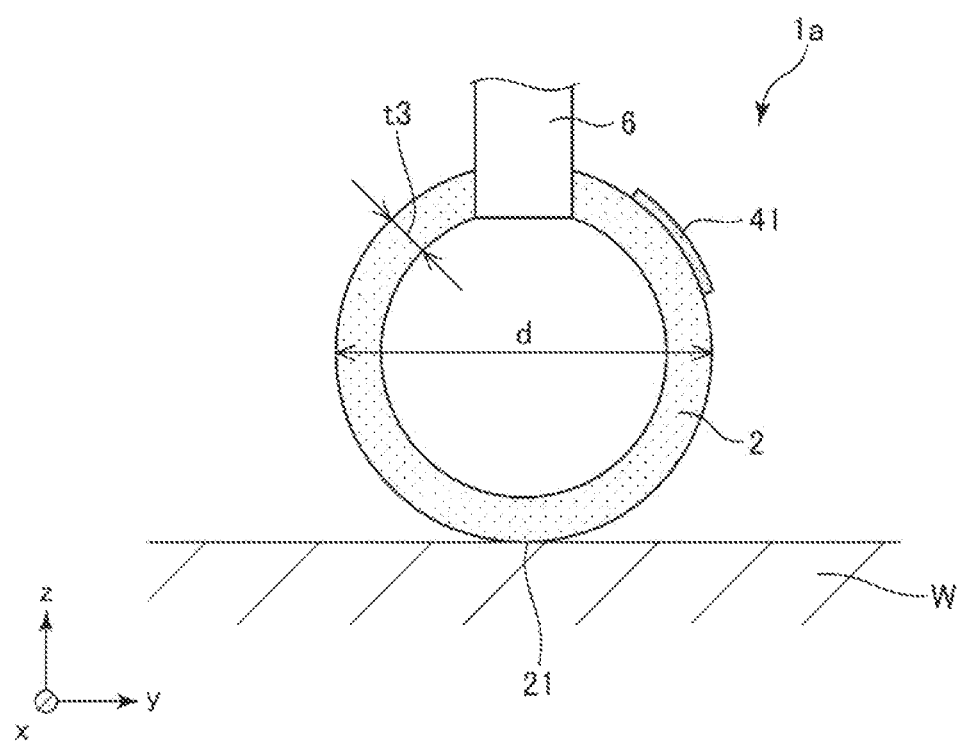
FIG. 10 is a side view showing a piezoelectric sensor according to a second embodiment.

FIG. 10 is a side view showing the piezoelectric sensor according to the second embodiment. It should be noted that in FIG. 10, an x axis, a y axis, and a z axis are set as three axes perpendicular to each other. Each of the axes is represented by an arrow, and a tip side is defined as a "positive" side, and a base end side is defined as a "negative" side. In the following description, an "x-axis direction" includes, for example, both of the positive direction and the negative direction of the x axis. Further, in the following description, the description will be presented defining the positive side in the z axis is referred to as an "upper side," and the negative side in the z axis is referred to as a "lower side," the positive side in the y axis is referred to as a "right side," and the negative side in the y axis is referred to as a "left side" in some cases.

The second embodiment will hereinafter be described. The following explanation is focused mainly on differences from the first embodiment, and the explanation of substantially the same matters will be omitted. It should be noted that in each of the drawings, the constituents substantially the same as those of the first embodiment are attached with the same reference symbols.

A piezoelectric sensor 1a according to the second embodiment is substantially the same as the piezoelectric sensor 1 according to the first embodiment except the point that the shape of the elastic body 2 and the arrangement of the piezoelectric element 41 are different, and a holding section 6 is provided instead of the regulatory section 3.

The piezoelectric sensor 1a shown in FIG. 10 is provided with the elastic body 2, the piezoelectric element 41, and the holding section 6. Further, although not shown in FIG. 10, the piezoelectric sensor 1a is also provided with the output circuit 49 having the detector 494 described above.

The elastic body 2 shown in FIG. 10 shaped like a circular cylinder centering on an axis parallel to the x axis. The elastic body 2 itself has the elasticity derived from the material, and at the same time, has elasticity derived from the shape of the circular cylinder. Therefore, the elastic body 2 has the excellent elasticity in a y-z plane.

Further, in the elastic body 2 shown in FIG. 10, a portion at the negative side in the z axis out of the outer circumferential surface of the circular cylinder forms a contact surface 21 which makes contact with the object W. The piezoelectric sensor 1a functions in good condition by making the contact surface 21 have contact with the object W.

The holding section 6 shown in FIG. 10 holds an upper portion of the elastic body 2 in the lower portion of the holding section 6. An upper portion of the holding section 6 is fixed to, for example, the finger parts 14, 15 of the robot hand 10. Thus, the distance between the elastic body 2 and the object W can be adjusted with the purpose.

The piezoelectric element 41 shown in FIG. 10 is arranged on the outer side surface of the elastic body 2 at a distance from the contact surface 21. Specifically, the piezoelectric element 41 is arranged between the holding section 6 and a position the farthest to the positive side in the y axis on the outer side surface of the elastic body 2.

According to such a configuration, even when the contact surface 21 of the elastic body 2 makes contact with the object W, it is possible to avoid the contact between the piezoelectric element 41 and the object W. Thus, it is possible to prevent the damage from occurring in the piezoelectric element 41. Further, since the elastic body 2 has the circularly cylindrical shape, even when arranging the piezoelectric element 41 at a position located at a distance from the contact surface 21, the frictional force generated between the elastic body 2 and the object W is converted into the deformation of the piezoelectric element 41 in good condition. Therefore, it is possible to efficiently detect the frictional force in the piezoelectric element 41. As a result, there is realized the piezoelectric sensor 1a excellent in sensitivity.

FIG. 11 is a diagram for explaining a deformation mode of the elastic body 2 when force is applied from a variety of directions to the piezoelectric sensor 1a shown in FIG. 10.

When no force is applied to the piezoelectric sensor 1a, the elastic body 2 keeps the natural state. Therefore, the piezoelectric element 41 keeps an initial shape as shown in an upper diagram in FIG. 11. An output voltage from the piezoelectric element 41 in this state is defined as an initial state.

When upward force is applied to the piezoelectric sensor 1a, the elastic body 2 deforms so as to flat in the vertical direction as shown in a middle diagram in FIG. 11. Thus, the bending radius of the piezoelectric element 41 decreases, and thus, the output voltage from the piezoelectric element 41 changes from the initial state. Therefore, it becomes possible to identify the state in which the upward force is applied based on the change. Such a state in which only the upward force is applied corresponds to, for example, a state in which the static frictional force is generated between the object W and the elastic body 2.

When leftward force is applied to the piezoelectric sensor 1a as shown in a lower diagram in FIG. 11 in the state in which the elastic body 2 flats in the vertical direction, the elastic body 2 deforms so that the holding section 6 and the contact surface 21 are shifted from each other in the horizontal direction (the y-axis direction). Thus, the bending radius of the piezoelectric element 41 becomes larger compared to when the upward force is applied to the piezoelectric sensor 1a. As a result, it becomes possible to identify the state in which the leftward force is applied to the piezoelectric sensor 1a. Such a state in which the leftward force is applied corresponds to, for example, a state in which the kinetic frictional force is generated between the object W and the elastic body 2.

As described hereinabove, also in the piezoelectric sensor 1a according to the present embodiment, it is possible to detect the static frictional force and the kinetic frictional force in substantially the same manner as in the first embodiment. Therefore, also in the piezoelectric sensor 1a, it is possible to obtain substantially the same output waveforms as in FIG. 7 through FIG. 9 corresponding to the static frictional force and the kinetic frictional force. Therefore, according also to the present embodiment, substantially the same advantages as in the first embodiment can be obtained.

It should be noted that an outside diameter d of the elastic body 2 in the natural state is not particularly limited, but is preferably no smaller than 10 mm and no greater than 100 mm, and more preferably no smaller than 20 mm and no greater than 80 mm.

Further, a thickness t3 of the elastic body 2 is not particularly limited, but is preferably no smaller than 1 mm and no greater than 10 mm, and more preferably no smaller than 2 mm and no greater than 8 mm.

4. Piezoelectric Sensor According To Third Embodiment

Then, a piezoelectric sensor according to a third embodiment will be described.

Figure 12:
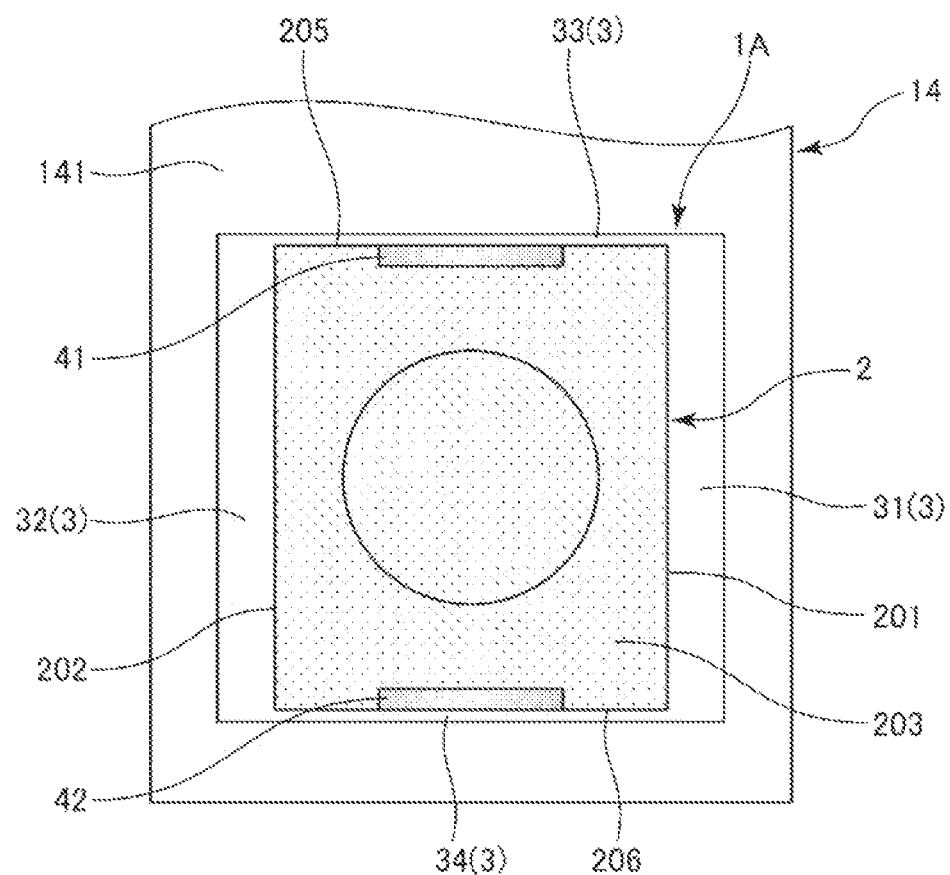
FIG. 12 is a plan view of a piezoelectric sensor according to a third embodiment when viewed from a position on the X axis.

FIG. 12 is a plan view of the piezoelectric sensor according to the third embodiment when viewed from a position on the X axis.

The third embodiment will hereinafter be described. The following explanation is focused mainly on differences from the first embodiment, and the explanation of substantially the same matters will be omitted. It should be noted that in each of the drawings, the constituents substantially the same as those of the first embodiment are attached with the same reference symbols.

A piezoelectric sensor 1A according to the third embodiment is substantially the same as the piezoelectric sensor 1 according to the first embodiment except the point that the piezoelectric sensor 1A is provided with a piezoelectric element 42 in addition to the piezoelectric element 41.

As shown in FIG. 12, the piezoelectric element 42 is disposed between the elastic body 2 and the fourth wall part 34. Further, when the bending deformation occurs in the fourth wall part 34 due to the deformation of the elastic body 2, a bending deformation also occurs similarly in the piezoelectric element 42. The piezoelectric element 42 is substantially the same in configuration as the piezoelectric element 41.

It should be noted that a relationship between the direction of the bending deformation of the piezoelectric element 42 and the output waveform from the piezoelectric element 42 can be the same as the relationship between the direction of the bending deformation of the piezoelectric element 41 and the output waveform from the piezoelectric element 41, but is preferably opposite to the relationship between the direction of the bending deformation of the piezoelectric element 41 and the output waveform from the piezoelectric element 41. In other words, when bending the piezoelectric element 42 and the piezoelectric element 41 in the same direction, the voltage signals to be output are preferably different in polarity from each other. Thus, it is possible to more accurately identify the direction of the force applied to the elastic body 2 based on the output waveforms from the two piezoelectric elements 41, 42. As a result, when the slippage occurs between the object W and the elastic body 2, it is possible to more accurately identify whether the object W slips upward or slips downward with respect to the elastic body 2.

Figure 13:
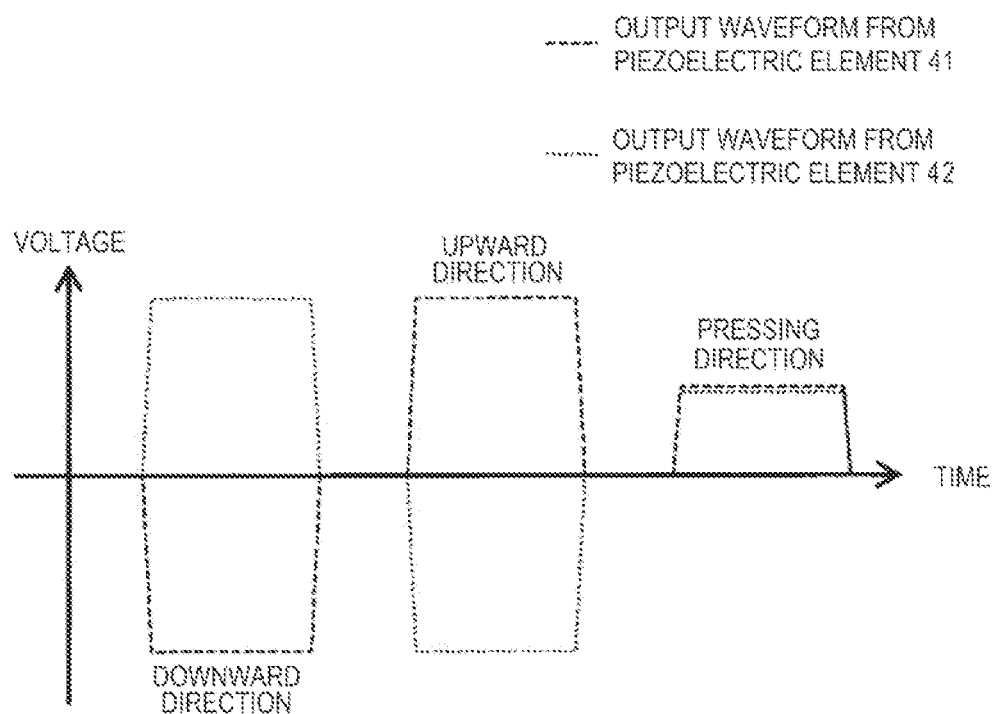
FIG. 13 is a diagram showing an example of waveforms (output waveforms) of voltage signals output from the piezoelectric elements shown in FIG. 12 when the elastic body has deformed in the deformation mode shown in FIG. 5.

FIG. 13 is a diagram showing an example of waveforms (output waveforms) of the voltage signals output from the piezoelectric elements 41, 42 shown in FIG. 12 when the elastic body 2 has deformed in the deformation mode shown in FIG. 5. It should be noted that the output waveforms shown in FIG. 13 are the waveforms obtained when adopting a configuration in which when bending the piezoelectric elements 41, 42 in respective directions the same as each other, the voltage signals different in polarity from each other are output. Further, in the example shown in FIG. 13, there are shown waveforms of relative potentials to the reference voltage.

When downward force is applied to the piezoelectric sensor 1A, a downward bending deformation occurs in each of the piezoelectric elements 41, 42. Therefore, the voltage signals different in polarity from each other are output from the piezoelectric elements 41, 42, respectively. For example, in the example shown in FIG. 13, it is possible to identify the fact that the downward force is applied to the piezoelectric sensor 1A based on the fact that the polarity of the voltage signal output from the piezoelectric element 41 is negative with respect to the reference voltage, and the polarity of the voltage signal output from the piezoelectric element 42 is positive with respect to the reference voltage. Further, based on such a state in which the downward force is applied, it is possible to detect the static frictional force and the kinetic frictional force generated between the object W and the elastic body 2. It should be noted that a direction of the voltage signal with respect to the reference voltage is decided in accordance with a polarization direction of the piezoelectric element and a circuit configuration, and can therefore be opposite to the above. In that case, an opposite result is obtained in the subsequent outputs.

When upward force is applied to the piezoelectric sensor 1A, an upward bending deformation occurs in each of the piezoelectric elements 41, 42. Therefore, the voltage signals different in polarity from each other are output from the piezoelectric elements 41, 42, respectively. For example, in the example shown in FIG. 13, it is possible to identify the fact that the upward force is applied to the piezoelectric sensor 1A based on the fact that the polarity of the voltage signal output from the piezoelectric element 41 is positive with respect to the reference voltage, and the polarity of the voltage signal output from the piezoelectric element 42 is negative with respect to the reference voltage. Further, based on such a state in which the upward force is applied, it is possible to detect the static frictional force and the kinetic frictional force generated between the object W and the elastic body 2.

When force in the pressing direction, namely force of pressing the elastic body 2 shown in FIG. 12 from the positive side in the X axis toward the negative side in the X axis, is applied to the piezoelectric sensor 1A, an upward bending deformation occurs in the piezoelectric element 41, and a downward bending deformation occurs in the piezoelectric element 42. Therefore, the voltage signals the same in polarity as each other are output from the piezoelectric elements 41, 42, respectively. Thus, it is possible to identify the fact that the force in the pressing direction is applied to the piezoelectric sensor 1A.

According also to such a third embodiment, substantially the same advantages as in the first embodiment can be obtained.

As described above, when making a plan view of the third surface 203, the elastic body 2 of the piezoelectric sensor 1A has the fifth surface 205 and the sixth surface 206 as two opposed surfaces corresponding to two sides opposed to each other. Further, the piezoelectric element 41 and the piezoelectric element 42 are arranged at positions where the piezoelectric element 41 and the piezoelectric element 42 are respectively exposed on the fifth surface 205 and the sixth surface 206.

According to such a configuration, by making the polarities of the voltage signals output when bending the piezoelectric elements 41, 42 in the same direction different from each other, for example, it is possible to make one of the voltage signals output from the piezoelectric elements 41, 42 increase from the reference voltage, and make the other thereof decrease from the reference voltage. Thus, a difference between the waveforms of the voltage signals output from the piezoelectric elements 41, 42 is made clearer. As a result, even when, for example, a noise is mixed in with the voltage signal, it is possible to easily identify the direction of the force applied to the elastic body 2.

5. Piezoelectric Sensor According To Fourth Embodiment

Then, a piezoelectric sensor according to a fourth embodiment will be described.

Figure 14:
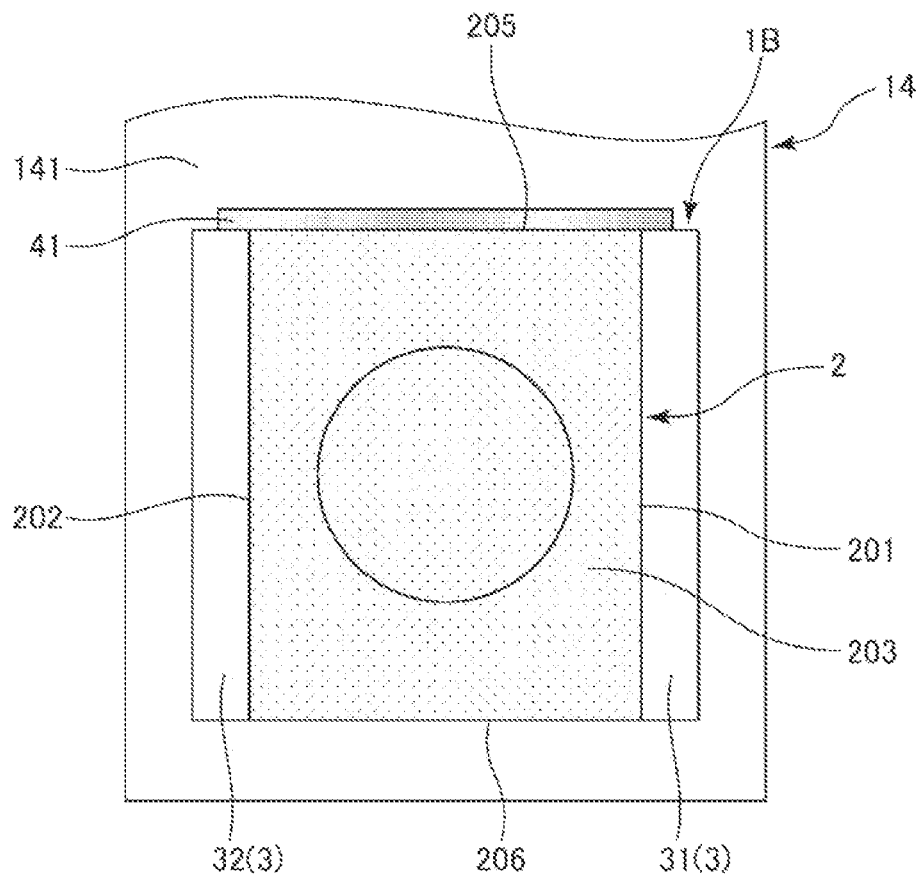
FIG. 14 is a plan view of a piezoelectric sensor according to a fourth embodiment when viewed from a position on the X axis.

FIG. 14 is a plan view of the piezoelectric sensor according to the fourth embodiment when viewed from a position on the X axis.

The fourth embodiment will hereinafter be described. The following explanation is focused mainly on differences from the first embodiment, and the explanation of substantially the same matters will be omitted. It should be noted that in each of the drawings, the constituents substantially the same as those of the first embodiment are attached with the same reference symbols.

In a piezoelectric sensor 1B according to the present embodiment, the elastic body 2 has the second surface 202 opposed to the first surface 201. Further, the regulatory section 3 is provided with first and second wall parts 31, 32. The first wall part 31 is arranged at a position where the first wall part 31 faces the first surface 201 of the elastic body 2, and the second wall part 32 is arranged at a position where the second wall part 32 faces the second surface 202 of the elastic body 2.

Specifically, in the first embodiment described above, the regulatory section 3 has the first and second wall parts 31, 32 and the third and fourth wall parts 33, 34. In contrast, in the present embodiment, the third and fourth wall parts 33, 34 are omitted. As a result, in the present embodiment, as shown in FIG. 14, the regulatory section 3 is constituted only by the first and second wall parts 31, 32.

Further, in the first embodiment described above, the piezoelectric element 41 is fixed to the third wall part 33. In contrast, in the present embodiment, the piezoelectric element 41 is fixed so as to connect the first and second wall parts 31, 32 to each other. Specifically, the piezoelectric element 41 is arranged at a position where the piezoelectric element 41 faces the fifth surface 205 of the elastic body 2, and at the same time, an end portion at the positive side in the Y axis of the piezoelectric element 41 is fixed to the first wall part 31, and an end portion at the negative side in the Y axis of the piezoelectric element 41 is fixed to the second wall part 32.

According to such a configuration, similarly to the first embodiment, the deformation of the elastic body 2 is limited by the first and second wall parts 31, 32 extending along the Z axis. Further, in the present embodiment, the third and fourth wall parts 33, 34 provided to the first embodiment are omitted. Therefore, the fifth surface 205 of the elastic body 2 is no longer subject to the limitation in deformation by the third and fourth wall parts 33, 34. As a result, the deformation amount of the piezoelectric element 41 is apt to become larger compared to the first embodiment.

Therefore, by arranging the piezoelectric element 41 at the position where the piezoelectric element 41 faces the fifth surface 205, it is possible to further increase the sensitivity of the piezoelectric sensor 1B.

FIG. 15 is a diagram for explaining a deformation mode of the elastic body 2 when force is applied from a variety of directions to the piezoelectric sensor 1B shown in FIG. 14.

When downward force is applied to the piezoelectric sensor 1B, a downward bending deformation occurs in the piezoelectric element 41 as shown in an upper right diagram in FIG. 15. On this occasion, a negative voltage signal with respect to the reference voltage, for example, is output from the piezoelectric element 41 as shown in FIG. 10. Thus, it is possible to identify the fact that the downward force is applied to the piezoelectric sensor 1B.

When upward force is applied to the piezoelectric sensor 1B, an upward bending deformation occurs in the piezoelectric element 41 as shown in a lower left diagram in FIG. 15. Therefore, a positive voltage signal with respect to the reference voltage, for example, is output from the piezoelectric element 41 as shown in FIG. 10. Thus, it is possible to identify the fact that the upward force is applied to the piezoelectric sensor 1B.

When force in the pressing direction, namely force of pressing the elastic body 2 shown in FIG. 15 from the positive side in the X axis toward the negative side in the X axis, is applied to the piezoelectric sensor 1B, an upward bending deformation occurs in the piezoelectric element 41 as shown in a lower right diagram in FIG. 15, but the deformation amount becomes smaller compared to when applying the upward force described above. Therefore, a positive voltage signal relatively smaller in voltage value with respect to the reference voltage, for example, is output from the piezoelectric element 41 as shown in FIG. 10. Thus, it is possible to identify the fact that the force in the pressing direction is applied to the piezoelectric sensor 1B.

According also to such a fourth embodiment as described above, substantially the same advantages as in the first embodiment can be obtained.

6. Piezoelectric Sensor According To Fifth Embodiment

Then, a piezoelectric sensor according to a fifth embodiment will be described.

Figure 16:
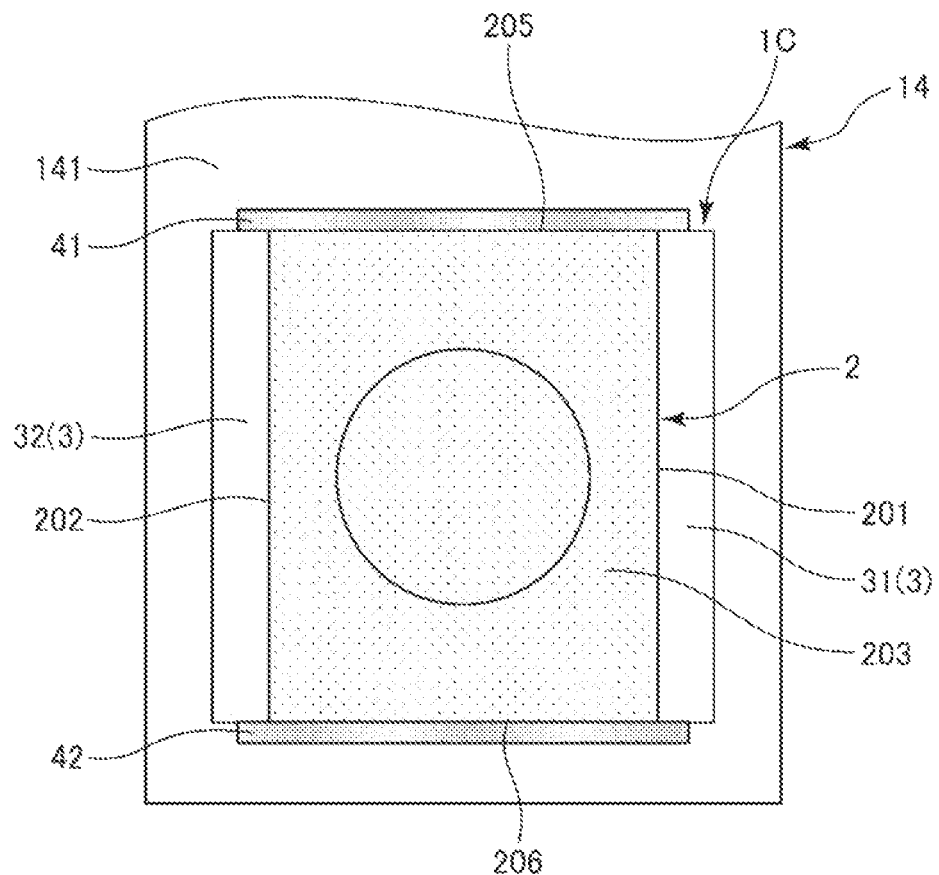
FIG. 16 is a plan view of a piezoelectric sensor according to a fifth embodiment when viewed from a position on the X axis.

FIG. 16 is a plan view of the piezoelectric sensor according to the fifth embodiment when viewed from a position on the X axis.

The fifth embodiment will hereinafter be described. The following explanation is focused mainly on differences from the third and fourth embodiments, and the explanation of substantially the same matters will be omitted. It should be noted that in each of the drawings, the constituents substantially the same as those of the third and fourth embodiments are attached with the same reference symbols.

A piezoelectric sensor 1C according to the fifth embodiment is substantially the same as the piezoelectric sensor 1B according to the fourth embodiment except the point that the piezoelectric sensor 1C is provided with the piezoelectric element 42 in addition to the piezoelectric element 41.

As shown in FIG. 16, the piezoelectric element 42 is fixed so as to connect the first and second wall parts 31, 32 to each other. Specifically, the piezoelectric element 42 is arranged at a position where the piezoelectric element 42 faces the sixth surface 206 of the elastic body 2, and at the same time, an end portion at the positive side in the Y axis of the piezoelectric element 42 is fixed to the first wall part 31, and an end portion at the negative side in the Y axis of the piezoelectric element 42 is fixed to the second wall part 32.

According to such a configuration, by making the polarities of the voltage signals output when bending the piezoelectric elements 41, 42 in the same direction different from each other, for example, it is possible to make one of the voltage signals output from the piezoelectric elements 41, 42 increase from the reference voltage, and make the other thereof decrease from the reference voltage similarly to the third embodiment. Therefore, a difference between the both parties becomes clear, and even when a noise is mixed in with the output signal, it is possible to easily identify the direction of the force applied to the elastic body 2.

According also to such a fifth embodiment as described above, substantially the same advantages as in the first through fourth embodiments can be obtained.

7. Piezoelectric Sensor According To Sixth Embodiment

Then, a piezoelectric sensor according to a sixth embodiment will be described.

Figure 17:
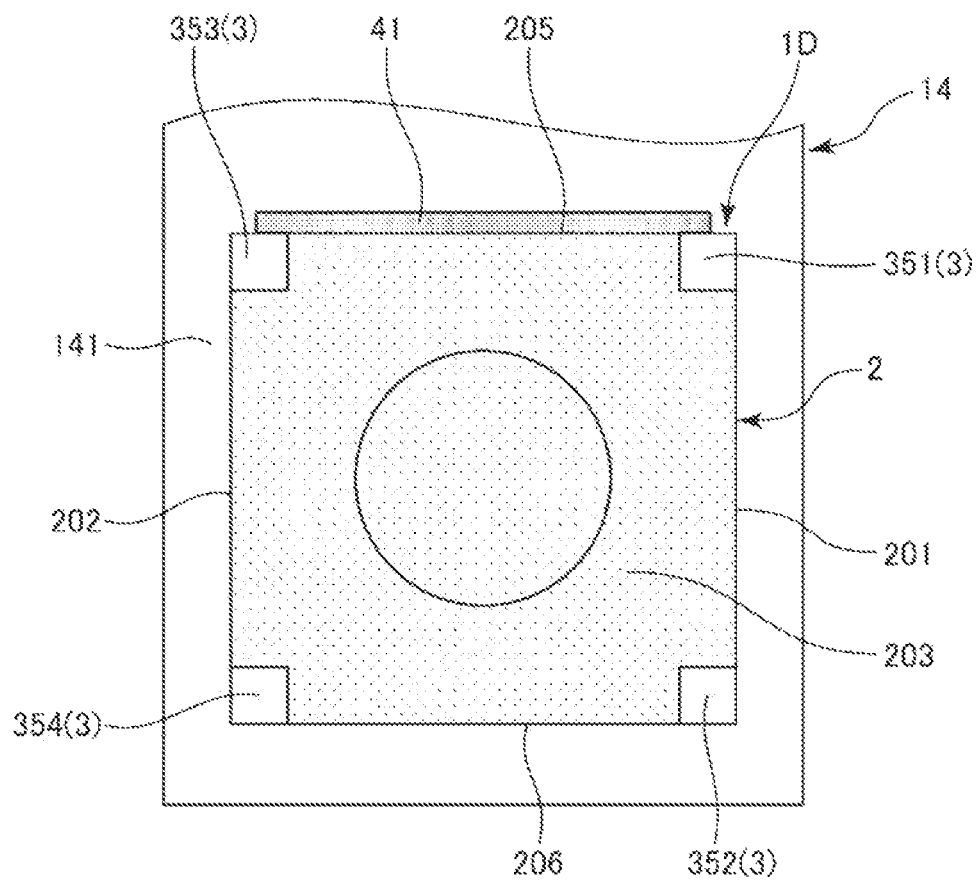
FIG. 17 is a plan view of a piezoelectric sensor according to a sixth embodiment when viewed from a position on the X axis.

FIG. 17 is a plan view of the piezoelectric sensor according to the sixth embodiment when viewed from a position on the X axis.

The sixth embodiment will hereinafter be described. The following explanation is focused mainly on differences from the fourth embodiment, and the explanation of substantially the same matters will be omitted. It should be noted that in each of the drawings, the constituents substantially the same as those of the fourth embodiment are attached with the same reference symbols.

A piezoelectric sensor 1D according to the sixth embodiment is substantially the same as the piezoelectric sensor 1B according to the fourth embodiment except the point that the shape of the regulatory section 3 is different.

The regulatory section 3 shown in FIG. 17 is provided with four columnar parts 351 through 354. The four columnar parts 351 through 354 are arranged at positions corresponding to four corners of the elastic body 2.

According to such a configuration, it is possible to suppress the volume of the regulatory section 3 to a minimum necessary value. Therefore, it is possible to achieve reduction in weight of the piezoelectric sensor 1D.

The columnar part 351 is arranged at a corner at the positive side in the Y axis and the positive side in the Z axis, and the columnar part 352 is arranged at a corner at the positive side in the Y axis and the negative side in the Z axis out of the four corners of the elastic body 2. The columnar part 353 is arranged at a corner at the negative side in the Y axis and the positive side in the Z axis, and the columnar part 354 is arranged at a corner at the negative side in the Y axis and the negative side in the Z axis out of the four corners of the elastic body 2.

As shown in FIG. 17, the piezoelectric element 41 is fixed so as to connect the columnar parts 351, 353 to each other.

According also to such a sixth embodiment as described above, substantially the same advantages as in the fourth embodiment can be obtained.

8. Piezoelectric Sensor According To Seventh Embodiment

Then, a piezoelectric sensor according to a seventh embodiment will be described.

Figure 18:
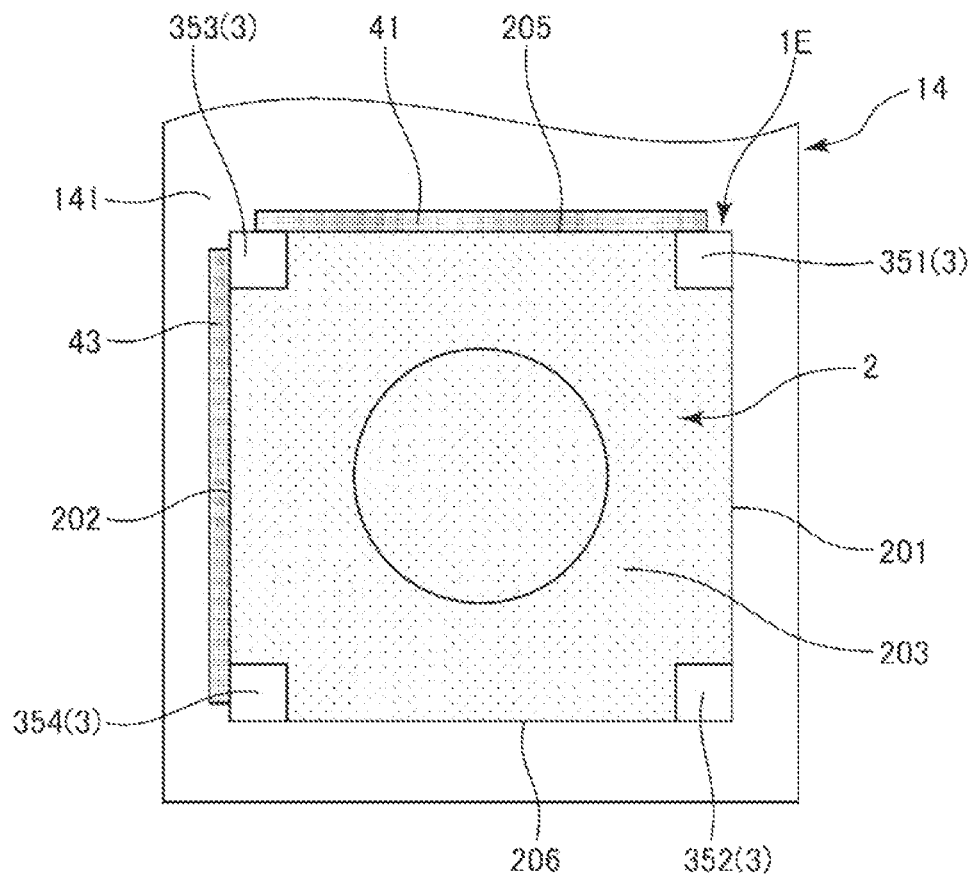
FIG. 18 is a plan view of a piezoelectric sensor according to a seventh embodiment when viewed from a position on the X axis.

FIG. 18 is a plan view of the piezoelectric sensor according to the seventh embodiment when viewed from a position on the X axis.

The seventh embodiment will hereinafter be described. The following explanation is focused mainly on differences from the fifth and sixth embodiments, and the explanation of substantially the same matters will be omitted. It should be noted that in each of the drawings, the constituents substantially the same as those of the fifth and sixth embodiments are attached with the same reference symbols.

A piezoelectric sensor 1E according to the seventh embodiment is substantially the same as the piezoelectric sensor 1D according to the sixth embodiment except the point that the piezoelectric sensor 1E is provided with a piezoelectric element 43 in addition to the piezoelectric element 41.

The piezoelectric element 43 is fixed so as to connect the columnar parts 353, 354 to each other.

In other words, the piezoelectric sensor 1E is provided with the plurality of piezoelectric elements 41, 43. Further, the piezoelectric elements 41, 43 are different in installation direction from each other, and therefore deform in respective deformation directions different from each other due to a deformation of the elastic body 2.

Specifically, the fifth embodiment described above is also provided with the plurality of piezoelectric elements 41, 42, but these piezoelectric elements 41, 42 deform in the same deformation direction due to the deformation of the elastic body 2. For example, since the piezoelectric elements 41, 42 each have the detection axis parallel to the Z axis, when downward force is applied to the elastic body 2, the downward bending deformation occurs in both of the piezoelectric elements 41, 42.

In contrast, in the piezoelectric sensor 1E according to the present embodiment, the piezoelectric element 41 is arranged at the position where the piezoelectric element 41 faces the fifth surface 205 of the elastic body 2 on the one robot hand, and the piezoelectric element 43 is arranged at the position where the piezoelectric element 43 faces the second surface 202 of the elastic body 2 on the other robot hand. In other words, the piezoelectric element 41 has the detection axis parallel to the Z axis on the one robot hand, the piezoelectric element 43 has the detection axis parallel to the Y axis on the other robot hand. Therefore, it becomes possible for the piezoelectric sensor 1E to detect not only a deformation in the Z-axis direction of the elastic body 2, but also a deformation in the Y-axis direction thereof.

According also to such a seventh embodiment as described above, substantially the same advantages as in the fifth and sixth embodiments can be obtained.

Figure 19:
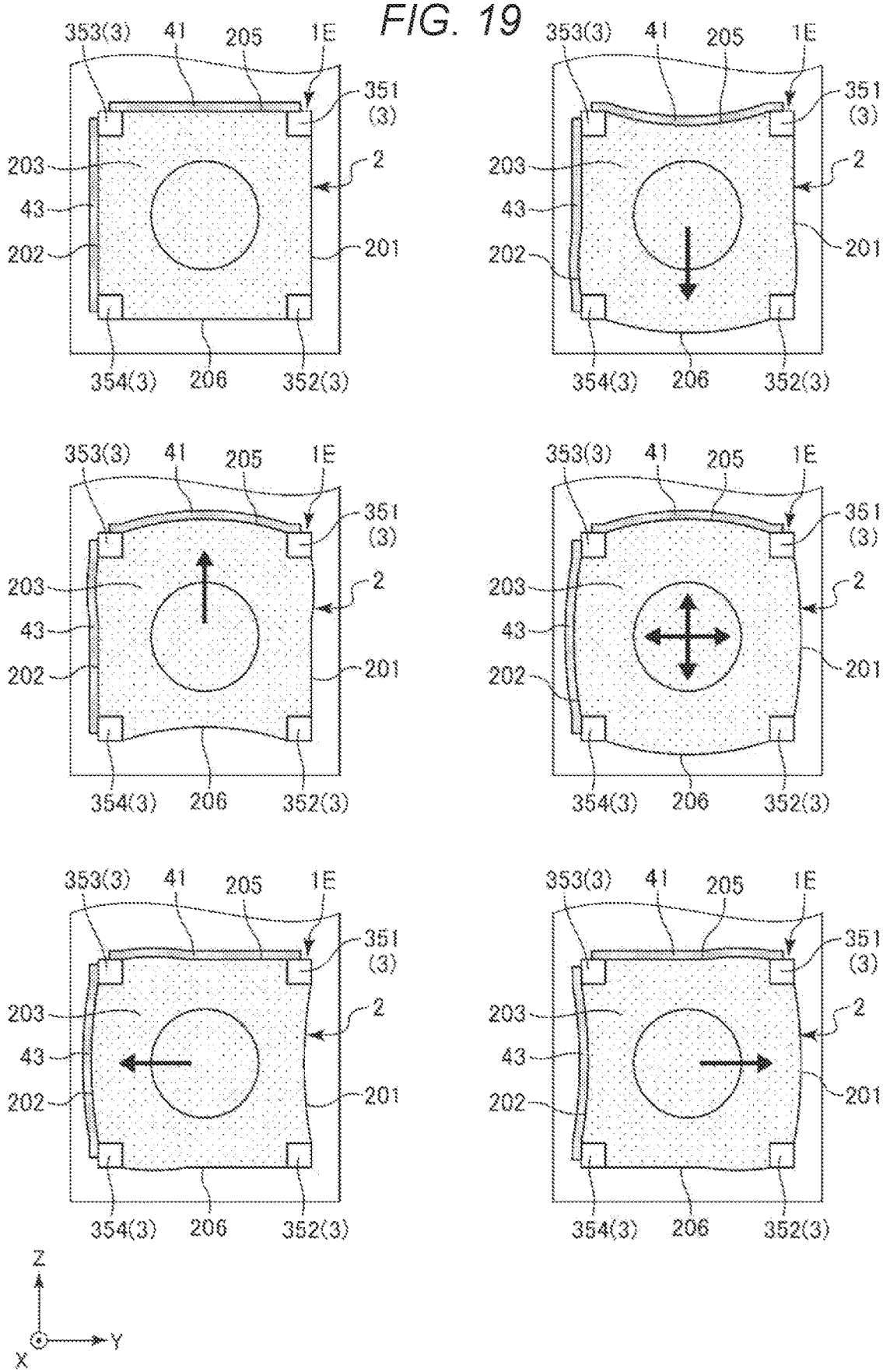
FIG. 19 is a diagram for explaining a deformation mode of an elastic body when force is applied from a variety of directions to the piezoelectric sensor shown in FIG. 18.
Figure 20:
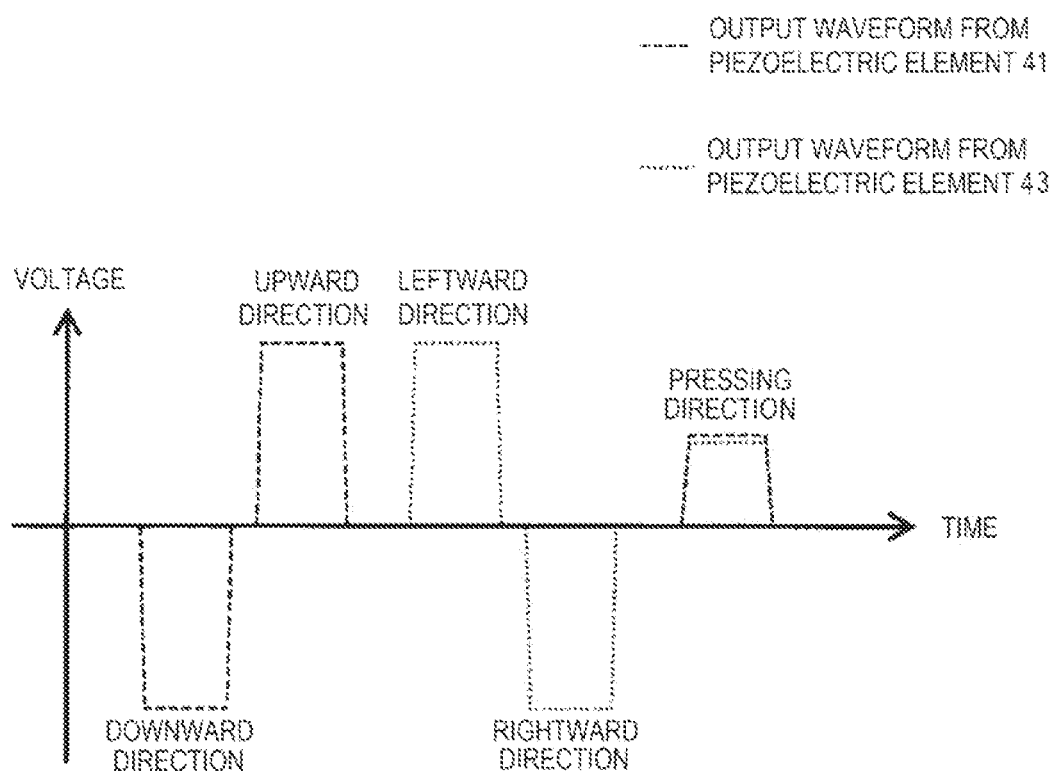
FIG. 20 is a diagram showing an example of a waveform (an output waveform) of a voltage signal output from the piezoelectric element shown in FIG. 18 when the elastic body has deformed in the deformation mode shown in FIG. 19.

FIG. 19 is a diagram for explaining a deformation mode of the elastic body 2 when force is applied from a variety of directions to the piezoelectric sensor 1E shown in FIG. 18. FIG. 20 is a diagram showing an example of waveforms (output waveforms) of the voltage signals output from the piezoelectric elements 41, 43 shown in FIG. 18 when the elastic body 2 has deformed in the deformation mode shown in FIG. 19. It should be noted that in the example shown in FIG. 20, there are shown waveforms of relative potentials to the reference voltage.

When downward force is applied to the piezoelectric sensor 1E, downward pulling force is applied to the third surface 203 of the elastic body 2 as indicated by an arrow in an upper right diagram in FIG. 19. Then, a downward bending deformation occurs in the piezoelectric element 41. On this occasion, a negative voltage signal with respect to the reference voltage, for example, is output from the piezoelectric element 41 as shown in FIG. 20. Thus, it is possible to identify the fact that the downward force is applied to the piezoelectric sensor 1E. Further, based on such a state in which the downward force is applied, it is possible to detect the static frictional force and the kinetic frictional force generated between the object W and the elastic body 2. In contrast, a deformation hardly occurs in the piezoelectric element 43. Therefore, a voltage signal increasing or decreasing from the reference voltage is hardly output from the piezoelectric element 43.

When upward force is applied to the piezoelectric sensor 1E, upward pulling force is applied to the third surface 203 of the elastic body 2 as indicated by an arrow in a middle left diagram in FIG. 19. Then, an upward bending deformation occurs in the piezoelectric element 41. On this occasion, a positive voltage signal with respect to the reference voltage, for example, is output from the piezoelectric element 41 as shown in FIG. 20. Thus, it is possible to identify the fact that the upward force is applied to the piezoelectric sensor 1E. Further, based on such a state in which the upward force is applied, it is possible to detect the static frictional force and the kinetic frictional force generated between the object W and the elastic body 2. In contrast, a deformation hardly occurs in the piezoelectric element 43. Therefore, a voltage signal increasing or decreasing from the reference voltage is hardly output from the piezoelectric element 43.

When force in a pressing direction, namely force of pressing the elastic body 2 shown in FIG. 19 from the positive side in the X axis toward the negative side in the X axis, is applied to the piezoelectric sensor 1E, a deformation of expanding in all directions occurs in the third surface 203 of the elastic body 2 as indicated by arrows in a middle right diagram in FIG. 19. Then, an upward bending deformation occurs in the piezoelectric element 41. On this occasion, a positive voltage signal relatively smaller in voltage value with respect to the reference voltage, for example, is output from the piezoelectric element 41 as shown in FIG. 20. Further, a leftward (a direction toward the negative side in the Y axis) bending deformation occurs in the piezoelectric element 43. On this occasion, a positive voltage signal relatively smaller in voltage value with respect to the reference voltage, for example, is output from the piezoelectric element 43 as shown in FIG. 20. Due to these voltage waveforms, it is possible to identify the fact that the force in the pressing direction is applied to the piezoelectric sensor 1E.

When leftward (a direction toward the negative side in the Y axis) force is applied to the piezoelectric sensor 1E, leftward pulling force is applied to the third surface 203 of the elastic body 2 as indicated by an arrow in a lower left diagram in FIG. 19. Then, a leftward bending deformation occurs in the piezoelectric element 43. On this occasion, a positive voltage signal with respect to the reference voltage, for example, is output from the piezoelectric element 43 as shown in FIG. 20. Thus, it is possible to identify the fact that the leftward force is applied to the piezoelectric sensor 1E. Further, based on such a state in which the leftward force is applied, it is possible to detect the static frictional force and the kinetic frictional force generated between the object W and the elastic body 2. In contrast, a deformation hardly occurs in the piezoelectric element 41. Therefore, a voltage signal increasing or decreasing from the reference voltage is hardly output from the piezoelectric element 41.

When rightward (a direction toward the positive side in the Y axis) force is applied to the piezoelectric sensor 1E, rightward pulling force is applied to the third surface 203 of the elastic body 2 as indicated by an arrow in a lower right diagram in FIG. 19. Then, a rightward bending deformation occurs in the piezoelectric element 43. On this occasion, a negative voltage signal with respect to the reference voltage, for example, is output from the piezoelectric element 43 as shown in FIG. 20. Thus, it is possible to identify the fact that the rightward force is applied to the piezoelectric sensor 1E. Further, based on such a state in which the rightward force is applied, it is possible to detect the static frictional force and the kinetic frictional force generated between the object W and the elastic body 2. In contrast, a deformation hardly occurs in the piezoelectric element 41. Therefore, a voltage signal increasing or decreasing from the reference voltage is hardly output from the piezoelectric element 41.

An example of the deformation mode is hereinabove described, but the deformation direction such as the upward direction, the downward direction, the leftward direction, and the rightward direction can be other directions.

As described above, when making a plan view of the third surface 203, the elastic body 2 of the piezoelectric sensor 1E has the fifth surface 205 and the second surface 202 as two adjacent surfaces corresponding to two sides adjacent to each other. Further, the piezoelectric element 41 and the piezoelectric element 43 are arranged at positions where the piezoelectric element 41 and the piezoelectric element 43 respectively face the fifth surface 205 and the second surface 202.

According to such a configuration, it is possible to realize the piezoelectric sensor 1E which is capable of detecting the direction of the applied force even when the force is applied from a larger number of directions than in the fourth embodiment. Specifically, it is possible to separately detect, for example, not only the force applied in the upward direction and the force applied in the downward direction, but also the force applied in the leftward direction and the force applied in the rightward direction. Thus, it is possible to closely catch a variety of motions of the robot hand 10 based on the output result of the piezoelectric sensor 1E. As a result, it is possible to more appropriately operate the robot hand 10, and it is possible to further enhance the convenience.

9. Piezoelectric Sensor According To Eighth Embodiment

Then, a piezoelectric sensor according to an eighth embodiment will be described.

Figure 21:
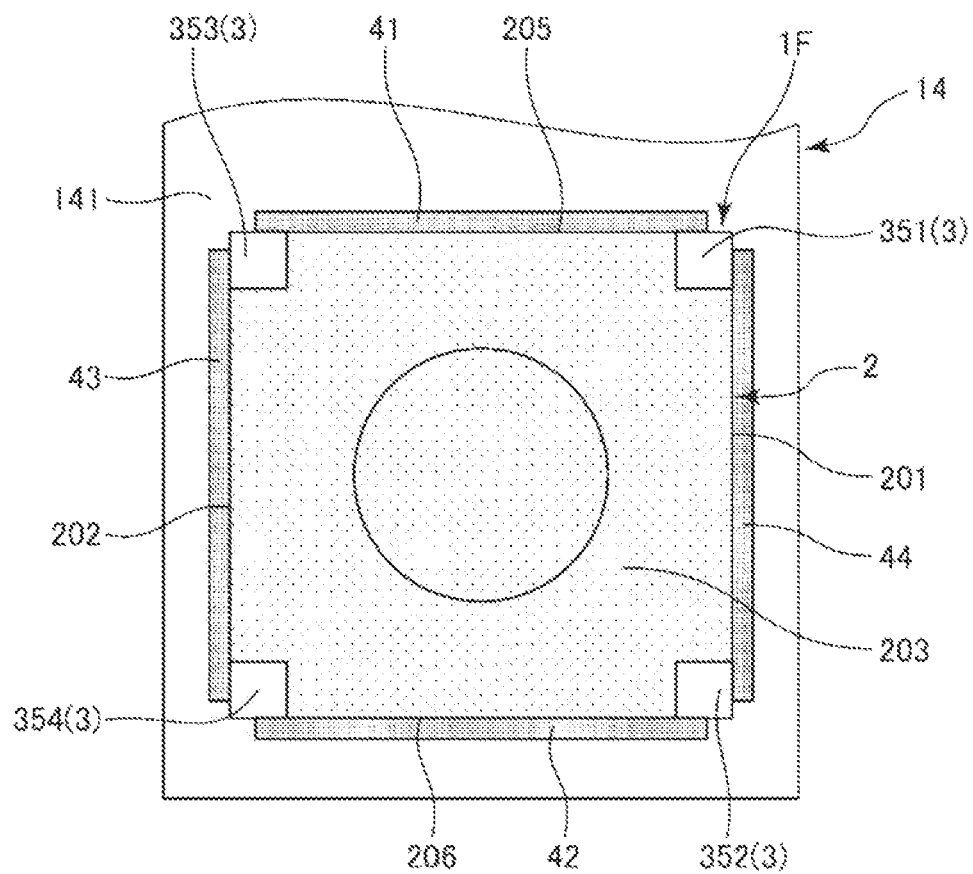
FIG. 21 is a plan view of a piezoelectric sensor according to an eighth embodiment when viewed from a position on the X axis.

FIG. 21 is a plan view of the piezoelectric sensor according to the eighth embodiment when viewed from a position on the X axis.

The eighth embodiment will hereinafter be described. The following explanation is focused mainly on differences from the sixth and seventh embodiments, and the explanation of substantially the same matters will be omitted. It should be noted that in each of the drawings, the constituents substantially the same as those of the sixth and seventh embodiments are attached with the same reference symbols.

A piezoelectric sensor 1F according to the eighth embodiment is substantially the same as the piezoelectric sensor 1E according to the seventh embodiment except the point that the piezoelectric sensor 1F is provided with piezoelectric elements 42, 44 in addition to the piezoelectric elements 41, 43.

The piezoelectric element 42 is fixed so as to connect the columnar parts 352, 354 to each other. The piezoelectric element 44 is fixed so as to connect the columnar parts 351, 352 to each other.

In other words, the piezoelectric sensor 1F is provided with the plurality of piezoelectric elements 41 through 44. Specifically, when making a plan view of the third surface 203, the elastic body 2 of the piezoelectric sensor 1F has the first surface 201, the second surface 202, the fifth surface 205, and the sixth surface 206 as four outer side surfaces corresponding to four sides constituting an outer edge. Further, as shown in FIG. 21, the piezoelectric element 41 is disposed at a position where the piezoelectric element 41 faces the fifth surface 205, the piezoelectric element 42 is disposed at a position where the piezoelectric element 42 faces the sixth surface 206, the piezoelectric element 43 is disposed at a position where the piezoelectric element 43 faces the second surface 202, and the piezoelectric element 44 is disposed at a position where the piezoelectric element 44 faces the first surface 201.

According to such a configuration, since the four piezoelectric elements 41 through 44 are arranged so as to surround the periphery of the elastic body 2, a voltage signals are output from at least two of the piezoelectric elements as a result irrespective of the direction of the force applied to the elastic body 2. Therefore, the piezoelectric sensor 1F according to the present embodiment is made to have both of the advantages exerted by the fifth embodiment and the advantages exerted by the seventh embodiment. Specifically, for example, it is possible to separately detect the force applied in the upward direction, the force applied in the downward direction, the force applied in the leftward direction, and the force applied in the rightward direction, and at the same time, make one of the voltage signals output from two piezoelectric elements increase from the reference voltage, and make the other thereof decrease from the reference voltage. Therefore, it is possible to detect the force applied in a variety of directions with higher accuracy.

Figure 22:
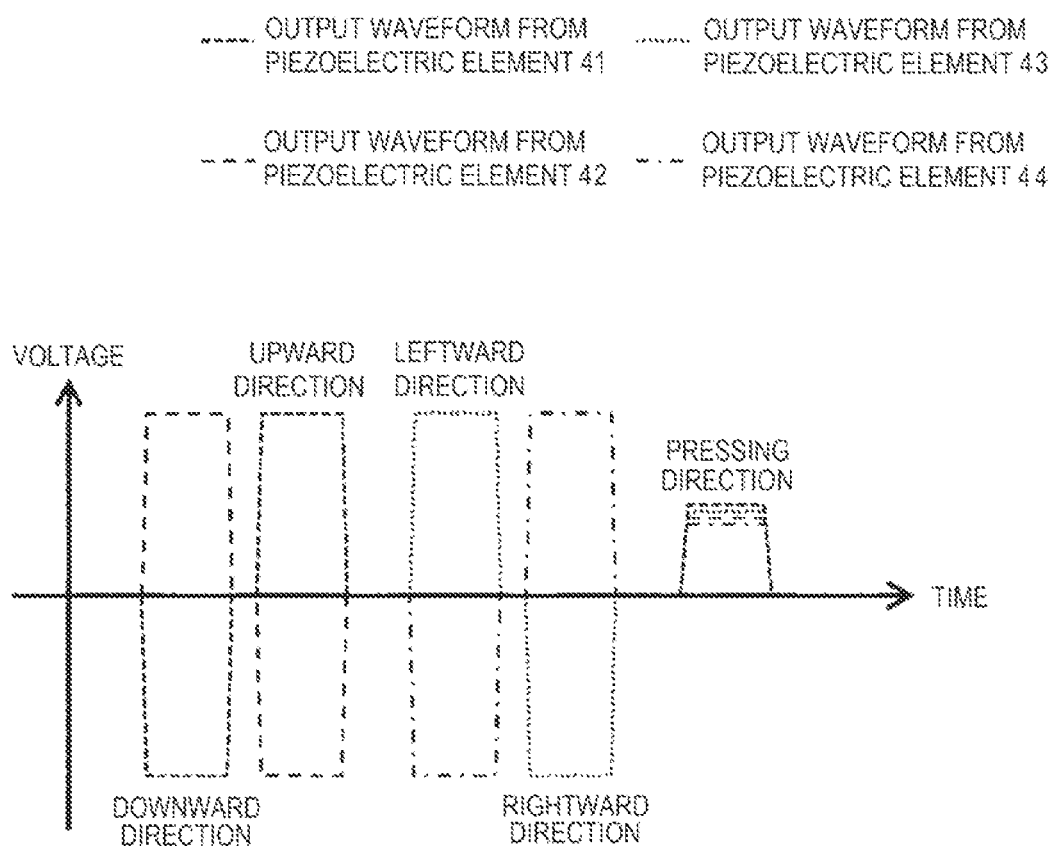
FIG. 22 is a diagram showing an example of a waveform (an output waveform) of a voltage signal output from the piezoelectric element shown in FIG. 21 when the elastic body has deformed in the deformation mode shown in FIG. 19.

FIG. 22 is a diagram showing an example of waveforms (output waveforms) of the voltage signals output from the piezoelectric elements 41 through 44 shown in FIG. 21 when the elastic body 2 has deformed in the deformation mode shown in FIG. 19. It should be noted that in the example shown in FIG. 22, there are shown waveforms of relative potentials to the reference voltage.

When downward force is applied to the piezoelectric sensor 1F, a downward bending deformation occurs in the piezoelectric element 41, and a negative voltage signal, for example, is output as shown in FIG. 22. Further, a downward bending deformation also occurs in the piezoelectric element 42, and a positive voltage signal with respect to the reference voltage, for example, is output as shown in FIG. 22.

When upward force is applied to the piezoelectric sensor 1F, an upward bending deformation occurs in the piezoelectric element 41, and a positive voltage signal, for example, is output as shown in FIG. 22. Further, an upward bending deformation also occurs in the piezoelectric element 42, and a negative voltage signal with respect to the reference voltage, for example, is output as shown in FIG. 22.

When force in the pressing direction, namely force of pressing the elastic body 2 shown in FIG. 21 from the positive side in the X axis toward the negative side in the X axis, is applied to the piezoelectric sensor 1F, an upward bending deformation occurs in the piezoelectric element 41, a downward bending deformation occurs in the piezoelectric element 42, a leftward bending deformation occurs in the piezoelectric element 43, and a rightward bending deformation occurs in the piezoelectric element 44, and positive voltage signals relatively smaller in voltage value with respect to the reference voltage are respectively output as shown in FIG. 22.

When leftward force is applied to the piezoelectric sensor 1F, a leftward bending deformation occurs in the piezoelectric element 43, and a positive voltage signal, for example, is output as shown in FIG. 22. Further, a leftward bending deformation also occurs in the piezoelectric element 44, and a negative voltage signal with respect to the reference voltage, for example, is output as shown in FIG. 22.

When rightward force is applied to the piezoelectric sensor 1F, a rightward bending deformation occurs in the piezoelectric element 43, and a negative voltage signal, for example, is output as shown in FIG. 22. Further, a rightward bending deformation also occurs in the piezoelectric element 44, and a positive voltage signal with respect to the reference voltage, for example, is output as shown in FIG. 22.

According also to such an eighth embodiment as described above, substantially the same advantages as in the sixth and seventh embodiments can be obtained.

10. Piezoelectric Sensor According To Ninth Embodiment

Then, a piezoelectric sensor according to a ninth embodiment will be described.

Figure 23:
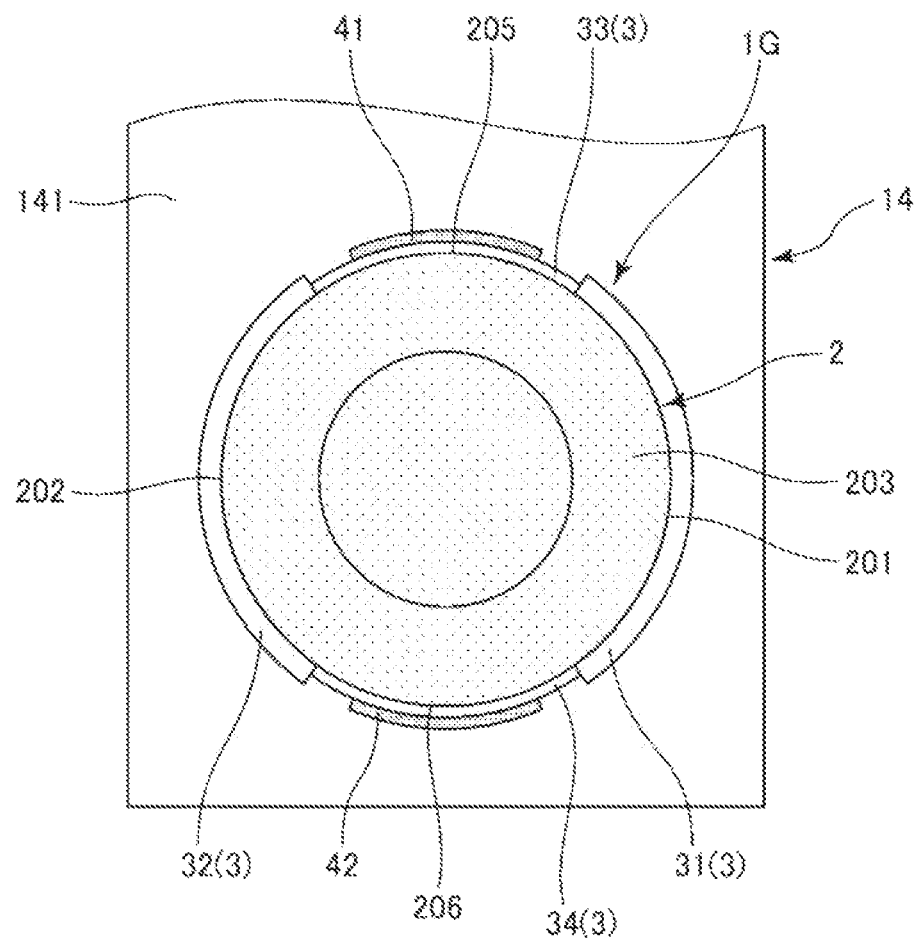
FIG. 23 is a plan view of a piezoelectric sensor according to a ninth embodiment when viewed from a position on the X axis.

FIG. 23 is a plan view of the piezoelectric sensor according to the ninth embodiment when viewed from a position on the X axis.

The ninth embodiment will hereinafter be described. The following explanation is focused mainly on differences from the third embodiment, and the explanation of substantially the same matters will be omitted. It should be noted that in each of the drawings, the constituents substantially the same as those of the third embodiment are attached with the same reference symbols.

A piezoelectric sensor 1G according to the ninth embodiment is substantially the same as the piezoelectric sensor 1A according to the third embodiment except the point that the regulatory section 3 has an annular shape.

In accordance with the regulatory section 3 having the annular shape, when making a plan view of the third surface 203 of the elastic body 2, the elastic body 2 has a circular shape as shown in FIG. 23. In other words, the third surface 203 of the elastic body 2 has a circular shape. The circular shape includes a true circle, an oval shape, an ellipse, and so on.

Since the planar shape of the elastic body 2 is a circular shape as described above, the shape anisotropy of the elastic body 2 becomes smaller compared to when the planar shape of the elastic body 2 is a rectangular shape. Thus, it is possible to detect the direction and the magnitude of the force while suppressing the variation in sensitivity due to the direction of the force to be applied to the piezoelectric sensor 1G.

Out of the regulatory section 3 forming the annular shape, a region at the positive side in the Y axis corresponds to the first wall part 31, and a region at the negative side in the Y axis corresponds to the second wall part 32. Further, a region at the positive side in the Z axis corresponds to the third wall part 33, and a region at the negative side in the Z axis corresponds to the fourth wall part 34.

Further, out of the side surface of the elastic body 2, namely the surface other than the third surface 203 and the fourth surface 204, a region at the positive side in the Y axis corresponds to the first surface 201, a region at the negative side in the Y axis corresponds to the second surface 202, a region at the positive side in the Z axis corresponds to the fifth surface 205, and a region at the negative side in the Z axis corresponds to the sixth surface 206. The first wall part 31 is disposed at a position where the first wall part 31 faces the first surface 201, the second wall part 32 is disposed at a position where the second wall part 32 faces the second surface 202, the third wall part 33 is disposed at a position where the third wall part 33 faces the fifth surface 205, and the fourth wall part 34 is disposed at a position where the fourth wall part 34 faces the sixth surface 206.

Further, while in the second embodiment described above, the piezoelectric element 41 is disposed between the elastic body 2 and the third wall part 33, and the piezoelectric element 42 is disposed between the elastic body 2 and the fourth wall part 34, in the present embodiment, the piezoelectric element 41 is fixed to a surface at an opposite side to the elastic body 2 of the third wall part 33, and the piezoelectric element 42 is disposed on a surface at an opposite side to the elastic body 2 of the fourth wall part 34.

According also to such a ninth embodiment as described above, substantially the same advantages as in the second embodiment can be obtained.

11. Piezoelectric Sensor According To Tenth Embodiment

Then, a piezoelectric sensor according to a tenth embodiment will be described.

Figure 24:
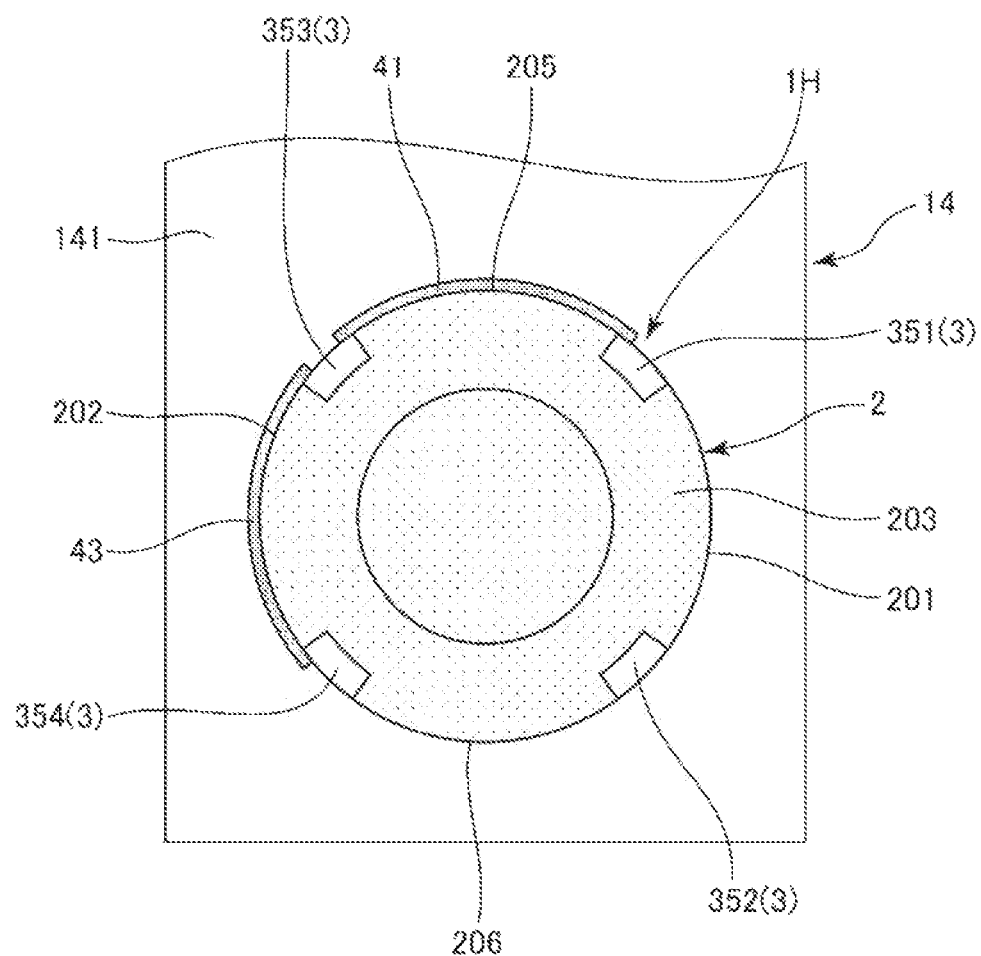
FIG. 24 is a plan view of a piezoelectric sensor according to a tenth embodiment when viewed from a position on the X axis.

FIG. 24 is a plan view of the piezoelectric sensor according to the tenth embodiment when viewed from a position on the X axis.

The tenth embodiment will hereinafter be described. The following explanation is focused mainly on differences from the seventh and ninth embodiments, and the explanation of substantially the same matters will be omitted. It should be noted that in each of the drawings, the constituents substantially the same as those of the seventh and ninth embodiments are attached with the same reference symbols.

A piezoelectric sensor 1H according to the tenth embodiment is substantially the same as the piezoelectric sensor 1E according to the seventh embodiment except the point that the regulatory section 3 has an annular shape.

Since the regulatory section 3 has the annular shape, when making a plan view of the third surface 203 of the elastic body 2, the elastic body 2 has a circular shape as shown in FIG. 24.

Since the planar shape of the elastic body 2 is a circular shape as described above, the shape anisotropy of the elastic body 2 becomes smaller compared to when the planar shape of the elastic body 2 is a rectangular shape. Thus, it is possible to detect the direction and the magnitude of the force while suppressing the variation in sensitivity due to the direction of the force to be applied to the piezoelectric sensor 1H.

The regulatory section 3 shown in FIG. 24 is provided with four columnar parts 351 through 354. With reference to the center of the elastic body 2, the columnar part 351 is located at the positive side in the Y axis, and the positive side in the Z axis. The columnar part 352 is located at the positive side in the Y axis, and the negative side in the Z axis. The columnar part 353 is located at the negative side in the Y axis, and the positive side in the Z axis. The columnar part 354 is located at the negative side in the Y axis, and the negative side in the Z axis. Further, the columnar parts 351, 352 are arranged at positions where the columnar parts 351, 352 are coplanar with the first surface 201, and the columnar parts 353, 354 are arranged at positions where the columnar parts 353, 354 are coplanar with the second surface 202. Further, the piezoelectric element 41 is fixed so as to connect the columnar parts 351, 353 to each other, and the piezoelectric element 43 is fixed so as to connect the columnar parts 353, 354 to each other.

According also to such a tenth embodiment as described above, substantially the same advantages as in the seventh and ninth embodiments can be obtained.

The piezoelectric sensor and the robot hand according to the present disclosure are hereinabove described based on the illustrated embodiments, but the piezoelectric sensor and the robot hand according to the present disclosure are not limited to the embodiments described above, and can be, for example, those obtained by replacing the constituents of the embodiments with those having substantially the same functions and arbitrary configurations, or those obtained by adding arbitrary constituents to the embodiments, or those obtained by combining two or more of the embodiments with each other.

What is claimed is:

1. A piezoelectric sensor comprising:
   an elastic body;
   a piezoelectric element which is disposed at a position where the piezoelectric element has contact with the elastic body, and which is configured to output a voltage signal when deforming in accordance with a deformation of the elastic body;
   a regulatory section configured to limit the deformation of the elastic body; and
   a detector configured to detect the voltage signal output from the piezoelectric element, wherein
   the elastic body has a first surface and a second surface opposed to the first surface,
   the regulatory section is disposed at a position where the regulatory section faces the first surface of the elastic body, and the regulatory section is provided with a first wall part disposed at a position where the first wall art faces the first surface, a second wall part disposed at a position where the second wall part faces the second surface, and third and fourth wall arts that connect the first and second wall arts to each other, the third and fourth wall parts being thinner in thickness that the first and second wall parts,
   the piezoelectric element is fixed to the third wall part, and
   the detector detects kinetic frictional force generated between an object and the elastic body based on a variation in the voltage signal due to the relative movement of the object to the elastic body.

2. The piezoelectric sensor according to claim 1, wherein the detector detects static frictional force generated between the object and the elastic body based on the voltage signal output from the piezoelectric element.

3. The piezoelectric sensor according to claim 1, wherein
the elastic body has a second surface opposed to the first surface,
the regulatory section is provided with two first wall parts disposed at a position where the first wall part faces the first surface, and a position where the first wall part faces the second surface, and
the piezoelectric element is fixed to the two first wall parts in end portions of the piezoelectric element.

4. The piezoelectric sensor according to claim 1, wherein
the elastic body is shaped like a plate having a third surface as a principal surface, and
the third surface has a rectangular shape.

5. The piezoelectric sensor according to claim 1, wherein
the elastic body has a contact surface configured to make contact with the object, and
the contact surface forms a convexly curved surface and is disposed at a position separated from the piezoelectric element.

6. The piezoelectric sensor according to claim 1 further comprising:
a holding section configured to hold the elastic body, wherein
the elastic body has a cylindrical shape,
the elastic body has a contact surface which is provided to an outer side surface, and is configured to make contact with the object, and
the piezoelectric element is disposed on the outer side surface separated from the contact surface.

7. A robot hand comprising:
the piezoelectric sensor according to claim 1, and
a pair of finger parts provided with the piezoelectric sensor.

8. A robot hand comprising:
the piezoelectric sensor according to claim 2, and
a pair of finger parts provided with the piezoelectric sensor.

9. A robot hand comprising:
the piezoelectric sensor according to claim 3, and
a pair of finger parts provided with the piezoelectric sensor.

10. A robot hand comprising:
the piezoelectric sensor according to claim 4, and
a pair of finger parts provided with the piezoelectric sensor.

11. A robot hand comprising:
the piezoelectric sensor according to claim 5, and
a pair of finger parts provided with the piezoelectric sensor.

12. A robot hand comprising:
the piezoelectric sensor according to claim 6, and
a pair of finger parts provided with the piezoelectric sensor.

* * * * *